(12) United States Patent
Miyata et al.

(10) Patent No.: US 11,733,100 B2
(45) Date of Patent: Aug. 22, 2023

(54) POLARIZATION IMAGING SYSTEM

(71) Applicant: Nippon Telegraph and Telephone Corporation, Tokyo (JP)

(72) Inventors: Masashi Miyata, Musashino (JP); Mitsumasa Nakajima, Musashino (JP); Toshikazu Hashimoto, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 368 days.

(21) Appl. No.: 17/271,162

(22) PCT Filed: Sep. 17, 2019

(86) PCT No.: PCT/JP2019/036314
§ 371 (c)(1),
(2) Date: Feb. 24, 2021

(87) PCT Pub. No.: WO2020/066738
PCT Pub. Date: Apr. 2, 2020

(65) Prior Publication Data
US 2021/0333151 A1 Oct. 28, 2021

(30) Foreign Application Priority Data

Sep. 26, 2018 (JP) ................... 2018-180793

(51) Int. Cl.
*G01J 4/04* (2006.01)
*G02B 5/30* (2006.01)
*G01J 4/00* (2006.01)
(52) U.S. Cl.
CPC .................. *G01J 4/04* (2013.01); *G02B 5/30* (2013.01); *G01J 2004/002* (2013.01)

(58) Field of Classification Search
CPC .................. G01J 4/04; G01J 2004/002; G01J 2003/2806; G01J 3/0256;
(Continued)

(56) References Cited

U.S. PATENT DOCUMENTS

2006/0262250 A1* 11/2006 Hobbs ................. G02B 5/3058
349/96
2009/0116029 A1* 5/2009 Ohtera ..................... G01J 3/513
359/885

(Continued)

OTHER PUBLICATIONS

Viktor Gruev et al., *CCD Polarization Imaging Sensor with Aluminum Nanowire Optical Filters*, Optics Express, vol. 18, No. 18, 2010, pp. 19087-19094.

(Continued)

*Primary Examiner* — Roy M Punnoose
(74) *Attorney, Agent, or Firm* — Workman Nydegger

(57) ABSTRACT

A polarization imaging image-pickup system includes an image-pickup unit array that includes a plurality of image-pickup units arranged two-dimensionally, wherein the image-pickup units each include: one wavefront control element that includes a plurality of microscopic structures; and a pixel array that is arranged so as to face the wavefront control element, and includes a plurality of pixels that are associated with the wavefront control element and are two-dimensionally arranged, and light from an imaging object is spatially separated by the one wavefront control element into first polarized light, and a second polarized light that is in a direction orthogonal to the first polarized light or has a rotation direction opposite to a rotation direction of the first polarized light, the first polarized light is collected at a first collection position on the pixel array, and the second polarized light is collected at a second collection position on the pixel array.

8 Claims, 13 Drawing Sheets

(58) Field of Classification Search
CPC .... G01J 2003/1213; G01J 3/0224; G01J 3/12; G02B 5/30; G02B 2207/123; G02B 27/286; G02B 5/3058; G03B 11/00; H01L 27/146
See application file for complete search history.

(56) References Cited

U.S. PATENT DOCUMENTS

| | | | | |
|---|---|---|---|---|
| 2018/0309949 | A1* | 10/2018 | Fossum | G02B 5/3058 |
| 2019/0257987 | A1* | 8/2019 | Saari | H04N 13/207 |
| 2021/0190593 | A1* | 6/2021 | Yao | G02B 5/3058 |
| 2021/0263070 | A1* | 8/2021 | Janunts | G01J 1/0429 |
| 2022/0057550 | A1* | 2/2022 | Saari | G03B 11/00 |

OTHER PUBLICATIONS

Jun Tanida et al., *Thin Observation Module by Bound Optics (TOMBO): Concept and Experimental Verification*, Applied Optics, vol. 40, No. 11, 2001, pp. 1806-1813.

\* cited by examiner

↔ POLARIZATION DIRECTION AT θ = 0°
⊙ POLARIZATION DIRECTION AT θ = 90°

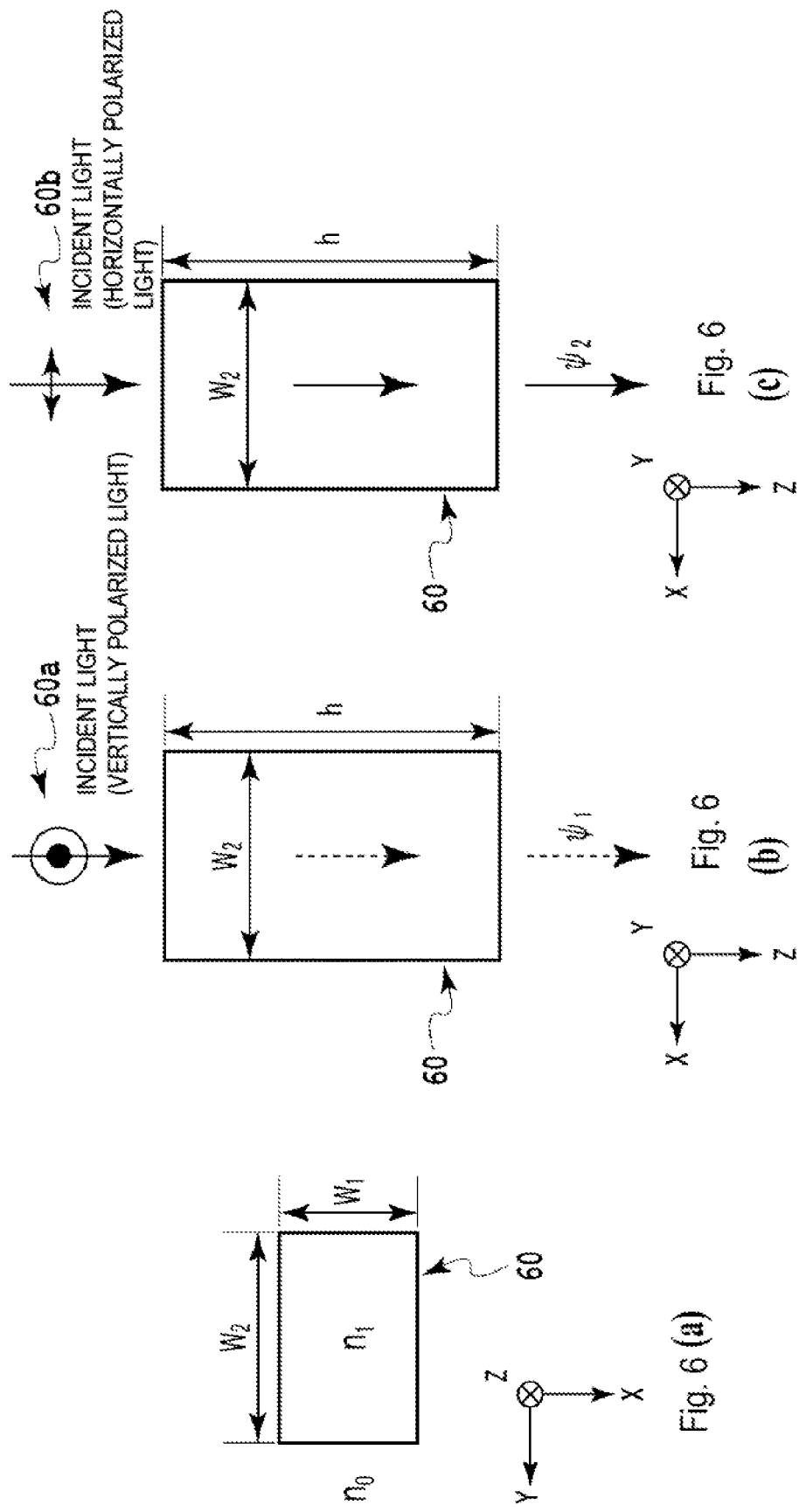

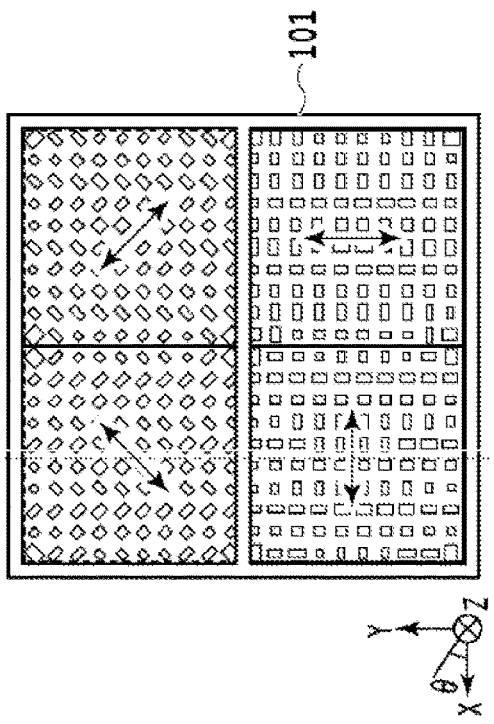
Fig. 10 (a)
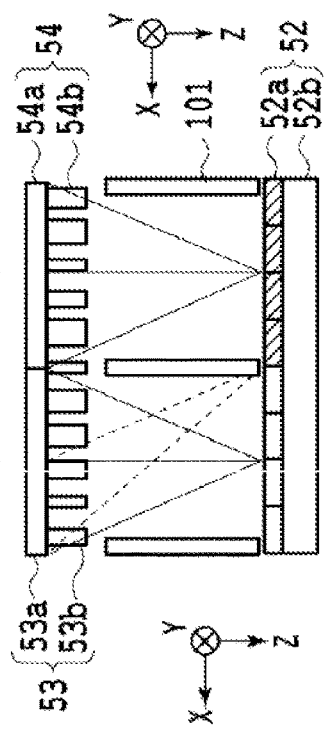
Fig. 10 (c)
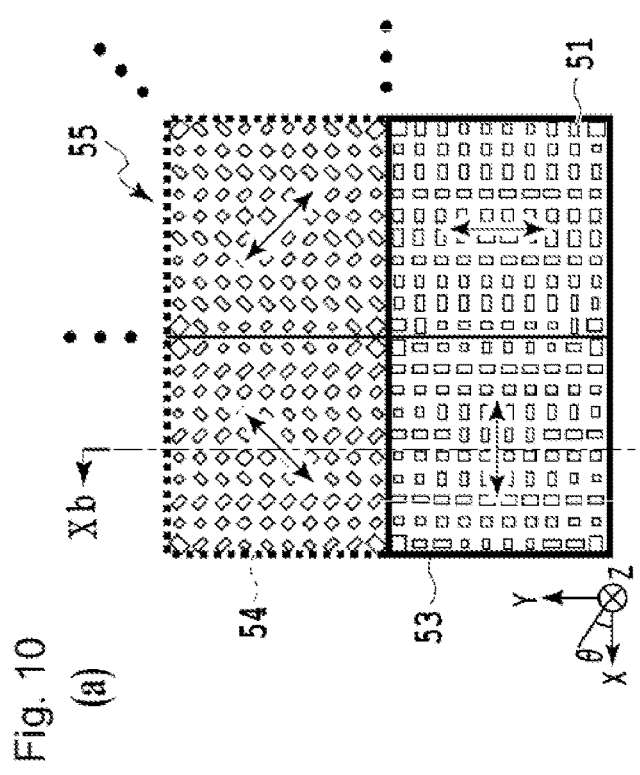
Fig. 10 (b)
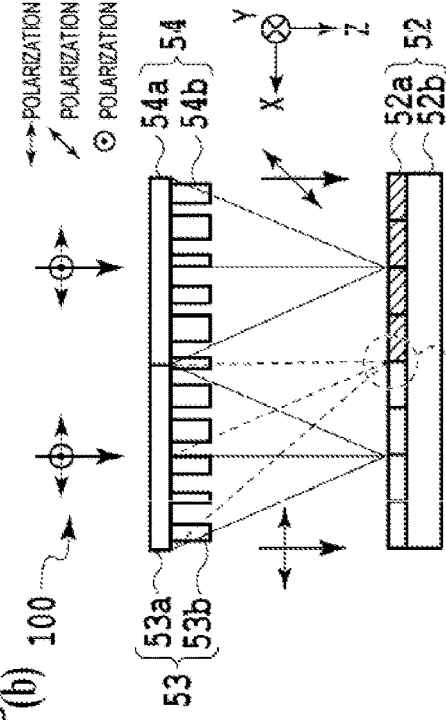
Fig. 10 (d)

↔ POLARIZATION DIRECTION AT θ = 0°
⊙ POLARIZATION DIRECTION AT θ = 90°

POLARIZATION IMAGING SYSTEM

TECHNICAL FIELD

The present invention relates to a polarization imaging image-pickup system that includes multiple wavefront control element allowing polarization separation.

BACKGROUND ART

A conventional, typical image-pickup element includes: an imaging optical system; and an image sensor, such as a two-dimensional image sensor (a charge coupled device (hereinafter called a CCD) sensor, or a complementary metal oxide semiconductor (hereinafter called a C-MOS) sensor), and acquires data that includes intensity information on light from an imaging object, and color information. The data is processed to form two-dimensional image. Here, the "light from an imaging object" refers to light radiated from an object serving as an imaging object, or light obtained by illuminating the imaging object with light radiated from a light source separated from the imaging object and causing the light to be reflected or scattered by the imaging object.

When the data is acquired, polarization information on the light from the imaging object is often ignored. However, the polarization information on the light includes beneficial information that cannot be acquired simply from the intensity of the light and its color, i.e., the wavelength; for example, the information relates to the shape of the surface of the imaging object and the state of the material. In general, a method of taking an image as two-dimensional information on the polarization state of the light from the imaging object is called polarization imaging. According to a conventional, typical polarization imaging, provided that on an imaging plane allowing an imaging object to be imaged thereon, a certain direction parallel to the imaging plane serves as a reference and is 0°, the light intensity of polarized light in each of directions rotated about an axis parallel to the optical axis by 45°, 90° and 135° is acquired. Accordingly, three among four Stokes parameters that represent the polarization states of light from the imaging object can be obtained. Specifically, information on the light intensity, the polarization direction and the polarization degree can be obtained. A two-dimensional image generated from data including such pieces of information can facilitate estimation of the surface shape of the imaging object, acquisition of data on the stress state of the material of the imaging object, and application to an object recognition technique on an imaging object. As for polarization imaging, based on characteristics of acquired data items, many researches and developments have been made for application to fields of astronomy, medical cares, sensing techniques and the like.

Particularly in recent years, for the sake of acquiring multi-dimensional information including polarization information on light from an imaging object for vehicle-mounted cameras, IoT (Internet of Things) devices, medical devices and the like, a polarization imaging device that can be easily fabricated, has high sensitivity, and is small-sized is expected to be realized.

As a method of achieving polarization imaging, a polarization imaging sensor that utilizes microfabrication technology has been proposed so far. For example, a device configuration and a method for acquiring light with four different polarization directions on a pixel-by-pixel basis by integrating a polarization filter on each pixel of an image sensor has been proposed, the polarization filter being formed of multiple metal wire grids configured to allow transmitted light to have predetermined polarization directions (Non-Patent Literature 1).

FIG. 1 is a schematic diagram showing an example of a conventional polarization imaging device that includes an image sensor provided with a typical imaging optical system and an absorption polarization filter. FIG. 1(a) is a schematic diagram showing the arrangement relationship between an imaging object 11, an imaging optical system 12, and an image-pickup element 13. FIG. 1(b) is a schematic diagram showing the correspondence relationship between multiple regions of the image-pickup element and the polarization directions of light detected in the respective regions. The right end of FIG. 1(a) indicates an enlargement of a rectangular part drawn with broken lines on the image-pickup element 13. This configuration can generate a two-dimensional image that includes polarization information, that is, a polarization image. Points disclosed in Non-Patent Literature 1 are described with reference to FIG. 1. The image-pickup element includes a polarization filter 13a, and an image sensor 13b. The polarization filter 13a and the image sensor 13b have flat plate shapes, and are divided in multiple regions as shown in FIG. 1(b). The divided regions of the polarization filter 13a and the image sensor 13b have coinciding sizes and positions as shown in the right end part of FIG. 1(a). The multiple regions of the polarization filter 13a include regions that only pass polarized light with electromagnetic fields oscillating in a direction parallel to the sheet (hereinafter called longitudinally polarized light), and regions that only pass polarized light with electromagnetic fields oscillating in the direction perpendicular to the sheet (hereinafter called transversely polarized light). Incident light 10 collected on the image-pickup element 13 is, for example, partially polarized light, which is light including polarized light and unpolarized light that are mixed with each other.

First, light from the imaging object 11 is collected through the imaging optical system 12 on the image-pickup element 13. Next, the incident light 10 collected on the image-pickup element 13 passes through the regions of the polarization filter 13a, and becomes light only with longitudinal polarization and light only with transverse polarization, which enter the regions of the image sensor that correspond to the respective regions of the polarization filter 13a. As a result, as shown in FIG. 1(b), a two-dimensional image corresponding to the longitudinal polarization and the transverse polarization is generated on the image sensor 13b.

As a similar method, a method of integrating a wavelength plate having microscopic structures, and a polarization filter on a sensor, and a method of integrating a polarization filter array having photonic crystals on a sensor, have been proposed.

A method of generating a changed image through the conventional image-pickup device shown in FIG. 1 can acquire the polarization state of light from the imaging object 11 by one image-pickup operation. It is, however, difficult to reduce the size of the polarization imaging device including the imaging optical system 12. This is because the distance between the imaging optical system 12 and the image-pickup element 13, that is, the thickness of the entire polarization imaging device is determined by the focal length of the imaging optical system 12. Here, to reduce the thickness of the entire polarization imaging device, a lens having a short focal length is required to be adopted as the imaging optical system 12. However, owing to limitation of the aperture and thickness of a lens and to a processing method to achieve it, it is difficult for the configuration of the polarization imaging device shown in FIG. 1 to achieve a short focal length. Accordingly, reduction in the size of the device is difficult without reduction in the quantity of light incident on the image sensor 13b, that is, reduction in lens aperture.

In such a background, as a configuration allowing significant reduction in the size of the entire polarization imaging device, a configuration of combining a microlens array configuring compound eyes with a polarization filter array has been proposed (Non-Patent Literature 2).

FIG. 2 is a schematic diagram showing an example of a polarization imaging device that includes a combination of a microlens array including multiple lenses, and a polarization filter array that includes polarization filters corresponding to the respective lenses. Points disclosed in Non-Patent Literature are described with reference to FIG. 2. The polarization imaging device includes: a microlens array 22 made up of multiple lenses as an imaging optical system; polarization filter arrays 23a arranged so as to allow multiple regions of the polarization filter arrays 23a to correspond to the respective lenses; and an image sensor 23b arranged so as to allow light having passed through the polarization filter array 23a to be incident thereon. Here, the microlens array 22, the polarization filter arrays 23a, and the image sensor 23b are arranged such that their longitudinal directions can be parallel to each other. The two polarization filter arrays 23a are arranged between the microlens array 22 and the image sensor 23b. The two polarization filter arrays 23a are each divided into multiple regions, and have a function of allowing each of the divided regions to selectively pass only longitudinally polarized light or transversely polarized light of incident light 20.

Light from an imaging object 21 is collected on each of the regions of one polarization filter array 23a through the microlens array 22. Next, the light beams having passed through the one polarization filter array 23a become longitudinally polarized light and transversely polarized light according to the light passing regions, further pass the other polarization filter array 23a, and enter the image sensor 23b. As a result, a two-dimensional image corresponding to the longitudinal polarization and the transverse polarization is generated on the image sensor 23b.

The configuration of the polarization imaging device shown in FIG. 2 can simultaneously acquire multiple two-dimensional images with the respective polarization directions of the light from the imaging object 21, by the operation described above. Furthermore, application of an image reconstruction algorithm or the like to data on the acquired two-dimensional images can recover the resolutions of the two-dimensional images (Non-Patent Literature 2).

In comparison with the single-eye configuration in FIG. 1, the compound-eye configuration in FIG. 2 can significantly reduce the aperture of each lens, thereby facilitating imaging with a short focal length. Accordingly, in comparison with the single-eye configuration, the compound-eye configuration can reduce the size of the polarization imaging device without reducing the quantity of light entering the image sensor.

CITATION LIST

Non-Patent Literature

Non-Patent Literature 1: Viktor Gruev, Rob Perkins, and Timothy York, CCD polarization imaging sensor with aluminum nanowire optical filters," Optics Express, 30 Aug. 2010, Vol. 18, No. 18, pp. 19087-19094

Non-Patent Literature 2: Jun Tanida, Tomoya Kumagai, Kenji Yamada, Shigehiro Miyatake, Kouichi Ishida, Takashi Morimoto, Noriyuki Kondou, Daisuke Miyazaki, and Yoshiki Ichioka, "Thin observation module by bound optics (TOMBO): concept and experimental verification," Applied Optics, 10 Apr. 2001, Vol. 40, No. 10, pp. 1806-1813

SUMMARY OF THE INVENTION

Technical Problem

However, the image-pickup methods according to the conventional configurations disclosed in Non-Patent Literature 1 and Non-Patent Literature 2 described above have two problems.

First, a problem common to the conventional image-pickup methods having the configurations disclosed in Non-Patent Literature 1 and Non-Patent Literature 2 is the low light detection efficiency of the image sensor due to use of a light attenuating polarization filter. The light attenuating polarization filter passes only polarized light parallel to a plane including the light traveling axis while reflecting or absorbing polarized light in the direction perpendicular thereto. Accordingly, the image-pickup method according to the conventional configuration necessarily reduces the total quantity of light reaching the image sensor. Specifically, the quantity decreases to 50% of the quantity of light incident on the polarization imaging device. That is, adoption of the light attenuating polarization filter in the configuration makes it difficult to achieve a polarization imaging device having high efficiency and high sensitivity.

Furthermore, in the conventional configuration disclosed in Non-Patent Literature 2, in addition to the imaging optical system, at least one polarization filter array 23a is required to have a position strictly aligned to the image sensor 23b or the lenses of the lens array 22 to which each of polarization filters corresponds, and the polarization filter array 23a is required to be arranged and integrated in proximity to the image sensor 23b or the lens array 22. Accordingly, there is a problem of increase in fabrication cost and implementation cost in comparison with a typical image-pickup element 13.

Means for Solving the Problem

An object of the present invention, which has been made in view of the problems described above, is to provide an image-pickup system that can obtain polarization information with high sensitivity, be easily fabricated, and be easily achieve reduction in size, and is for generating a polarization image (hereinafter called a polarization imaging image-pickup system in some cases).

An embodiment of the present invention provides a polarization imaging image-pickup system that simultaneously generates a plurality of polarization images of an imaging object without reducing the light intensity, and includes an image-pickup unit array that includes a plurality of image-pickup units arranged two-dimensionally, wherein the image-pickup units each includes: one wavefront control element that includes a plurality of microscopic structures; and a pixel array that is arranged so as to face the wavefront control element, and includes a plurality of pixels that are associated with the wavefront control element and are two-dimensionally arranged, and light from an imaging object is spatially separated by the one wavefront control element into first polarized light, and a second polarized light that is in a direction orthogonal to the first polarized light or has a rotation direction opposite to a rotation direction of the first polarized light, the first polarized light is collected at a first collection position on the pixel array, and the second polarized light is collected at a second collection position on the pixel array.

Effects of the Invention

The present invention can realize the imaging device that can acquire polarization information at a high light use efficiency, and facilitates reduction in size, which can achieve implementation of the polarization imaging device in various devices, and usage as a portable small-sized imaging device. Furthermore, the device can be configured only by directly fabricating or attaching the wavefront control element immediately on an existing image sensor. Accordingly, the productivity is excellent, and the number of components is allowed to be small. Consequently, the polarization imaging device with a low cost can be realized.

BRIEF DESCRIPTION OF DRAWINGS

FIG. 6 is a schematic diagram of columnar microscopic structures 60 arranged on wavefront control elements 53 and 54.

FIG. 10 is a schematic diagram showing difference in crosstalk suppression before and after installation of barriers 101 in a configuration of an image-pickup unit array 55 when multiple polarization images are generated by the configuration of the image-pickup unit array 55.

DESCRIPTION OF EMBODIMENTS

Hereinafter, embodiments of the present invention are described in detail. The embodiments of the present invention can be replaced and modified without being limited by the following examples, only if not departing from the scope of the gist of the present invention.

First, before description of the embodiments of the present invention, the configuration of a polarization imaging image-pickup system and the operation of an image-pickup unit, which are an embodiment of the present invention, are overviewed as follows.

(1) Configuration of Polarization Imaging Image-Pickup System

Figure 1A:
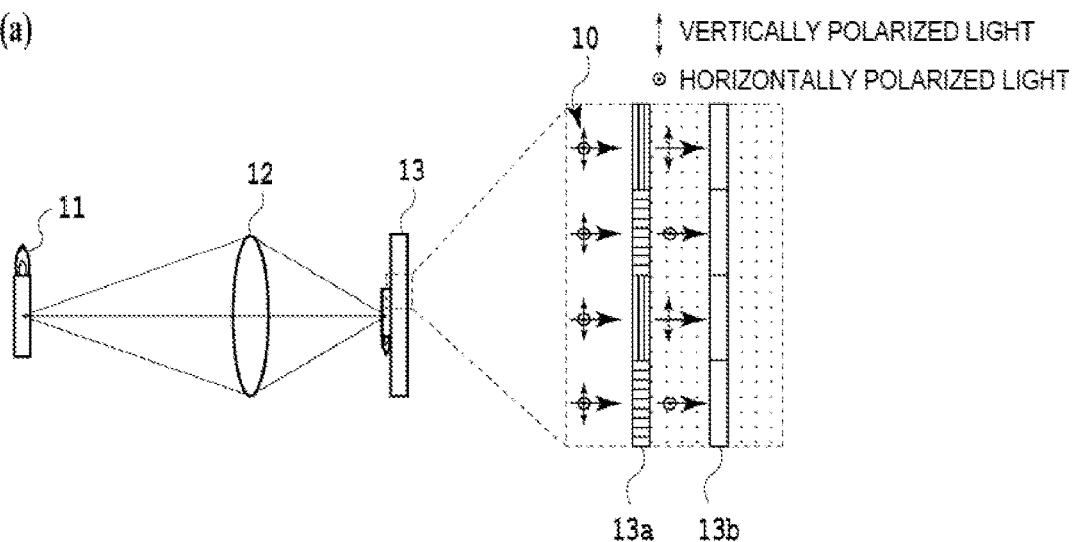
FIG. 1 is a schematic diagram showing an example of a conventional polarization imaging device that includes an image sensor provided with a typical imaging optical system and an absorption polarization filter.
Figure 1B:
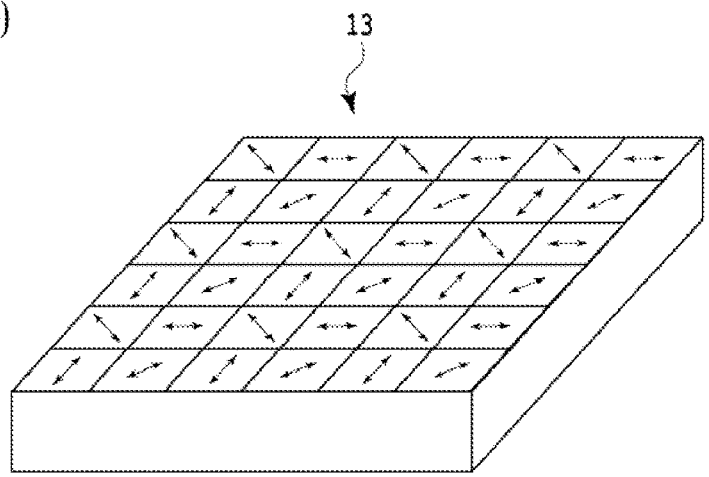
Figure 2:
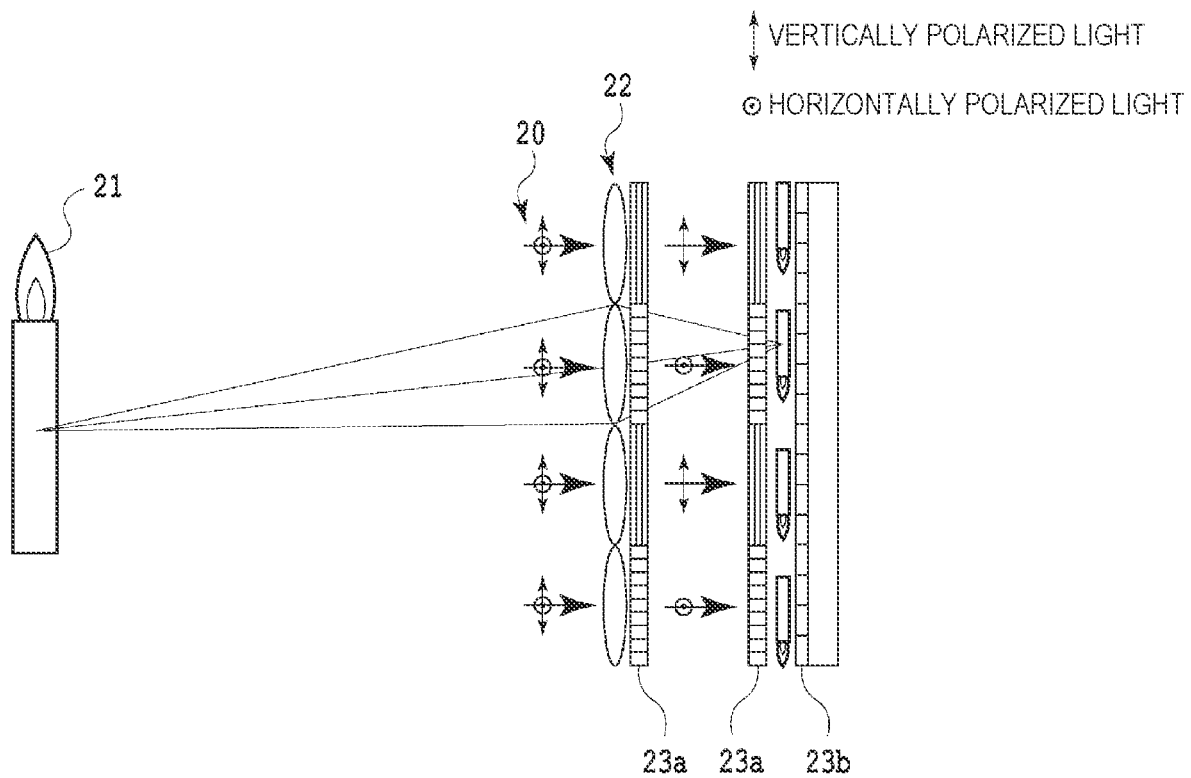
FIG. 2 is a schematic diagram showing an example of a polarization imaging device that includes a combination of a microlens array including multiple lenses, and a polarization filter array that includes polarization filters corresponding to the respective lenses.
Figure 3:
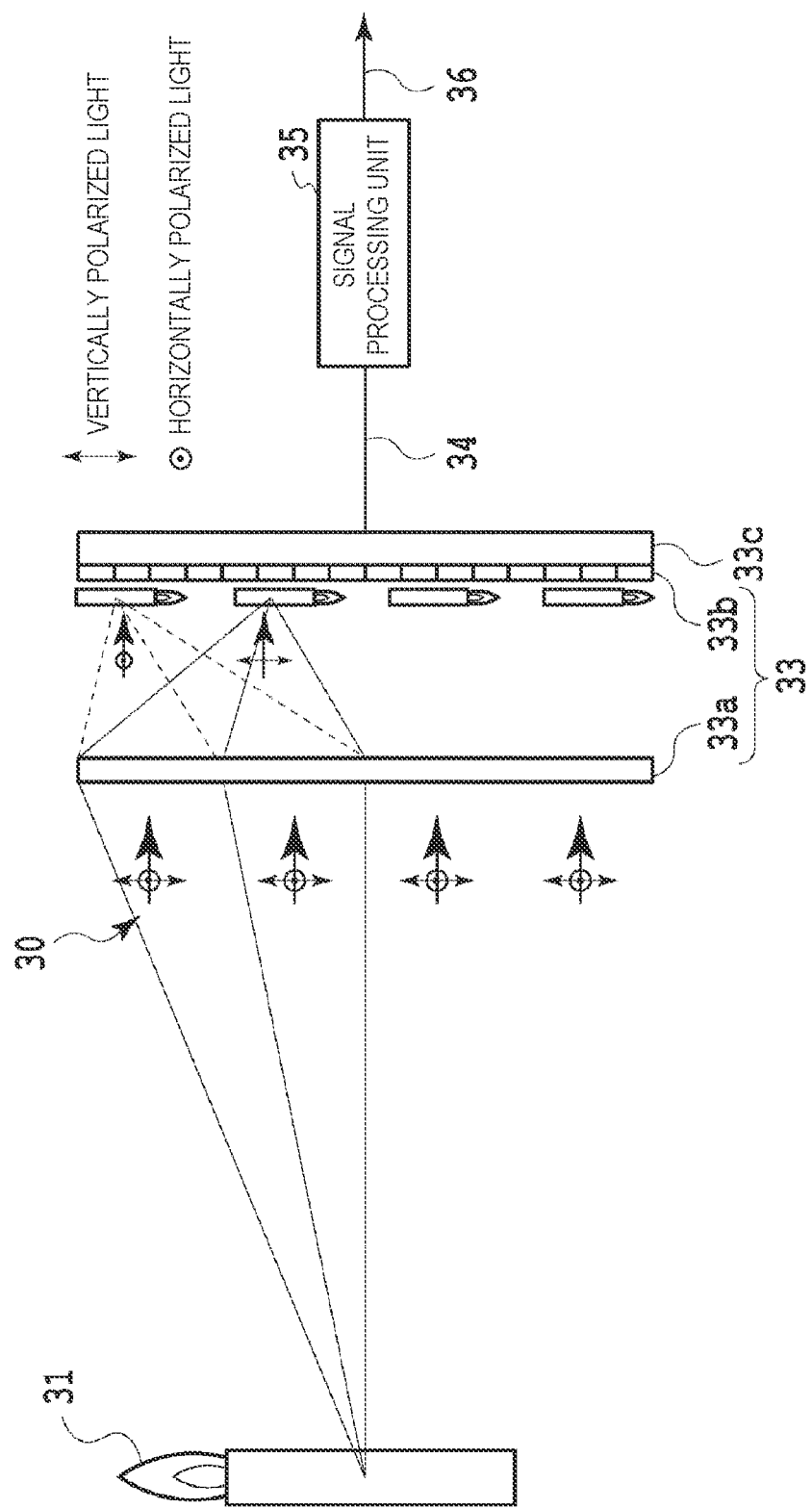
FIG. 3 is a schematic diagram showing a configuration of a polarization imaging image-pickup system that is one embodiment of the present invention.

FIG. 3 is a schematic diagram showing a configuration of a polarization imaging image-pickup system that is one embodiment of the present invention. The basic configuration of the polarization imaging image-pickup system according to one embodiment of the present invention includes: an image-pickup unit array 33 that includes a pixel array 33b where pixels including photoelectric conversion elements are two-dimensionally arranged, and a wavefront control element array 33a where wavefront control elements are two-dimensionally arranged; and a signal processing unit 35. One rectangular region in the pixel array 33b indicates one pixel. The image-pickup unit array 33 is mounted on a substrate 33c. The image-pickup unit array 33 is electrically connected to the signal processing unit 35 via the substrate 33c and wiring 34.

Note that the pixel array 33b can include elements required to configure an image formation element, the elements including a photoelectric conversion element array, a microlens array, a transparent layer, a color filter array, and a wiring layer. These elements are omitted from the drawings accompanying the Description of the present application.

The pixel array 33b may adopt any of configurations of a back-illuminated type allowing light to be incident on a surface where no wiring layer is arranged, and a front-illuminated type allowing light to be incident on a surface where the wiring layer is arranged. The image-pickup unit array 33 is described. The image-pickup unit array 33 includes a plurality of two-dimensionally arranged image-pickup units. One image-pickup unit is formed such that multiple pixels in the pixel array 33b can correspond to one wavefront control element in the wavefront control element array 33a.

Each wavefront control element has a function of imaging light having passed through the wavefront control elements 33a, at different positions on the pixel array 33b with respect to the corresponding polarization directions, according to the polarization directions of light fluxes of light 30 from the imaging object.

The signal processing unit 35 processes a photoelectric conversion signal output from the pixel array 33b via the substrate 33c and the wiring 34, and generates an image signal. The signal processing unit 35 includes an image signal output path 36 that transmits the generated image signal to the outside.

Note that the polarization imaging image-pickup system that is one embodiment of the present invention can include publicly known elements for configuring the polarization imaging image-pickup system, the elements including an optical filter for blocking infrared light, an electronic shutter, a power source, and a flashlight. Illustration and description of these elements are omitted in Description of the present application, and also omitted in the drawings accompanying the Description of the present application.

(2) Operation of Image-Pickup Unit

Figure 4:
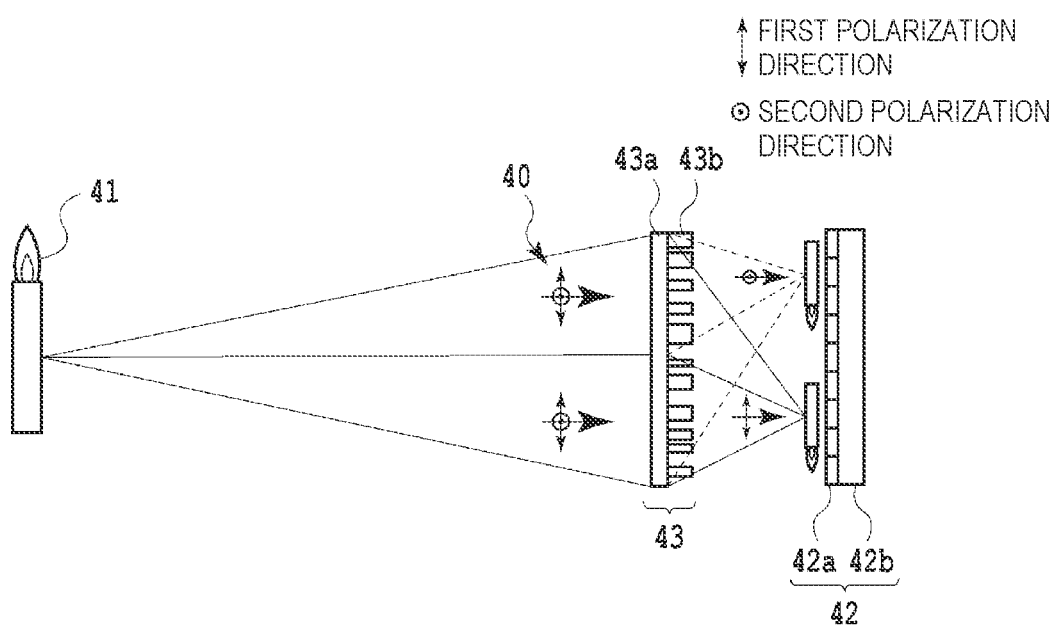
FIG. 4 is a schematic diagram showing a configuration example of an image-pickup unit that is a configuration element of the polarization imaging image-pickup system according to the one embodiment of the present invention.

FIG. 4 is a schematic diagram showing a configuration example of an image-pickup unit that is a configuration element of the polarization imaging image-pickup system according to the one embodiment of the present invention. FIG. 4 is a side sectional view of one image-pickup unit.

First, the configuration of the image-pickup unit is described. The image-pickup unit includes one wavefront control element 43, and a pixel array 42a including multiple pixels two-dimensionally arranged on a substrate 42b. In this example, the wavefront control element 43 is configured such that multiple microscopic structures 43b having a constant height are provided perpendicularly on half a surface of a microscopic structure support substrate 43a. In this example, the shape of each of the microscopic structures 43b is columnar. The structure of the wavefront control element 43 is not limited to this structure. In particular, the microscopic structures 43b may have various forms in consideration of the number of arranged pieces, the arrangement interval, the shape, and the arrangement pattern on the microscopic structure support substrate 43a. The microscopic structures 43b may be connected to and coupled with each other, or may adopt a form of being embedded in a material that is transparent to light 40 from an imaging object 41, i.e., does not cause light absorption.

Preferably, in one embodiment of the present invention described below, the material of the microscopic structures 43b of the wavefront control element 43 is appropriately selected according to the wavelength of the light 40 from the imaging object.

In a case where the wavelength of the light 40 from the imaging object is in the visible light region ranging from 380 to 800 nm, silicon nitride ($Si_3N_4$), silicon carbide (SiC), titanium dioxide ($TiO_2$), titanium dioxide (GaN), and other materials including inorganic carbide or inorganic nitride have a high refractive index and a low light absorption loss, and can be preferably used accordingly.

In a case where the wavelength of the light 40 from the imaging object is in a near-infrared region ranging from 800 to 1000 nm, silicon (Si), SiC, SiN, $TiO_2$, gallium arsenide (GaAs), GaN and the like can be preferably used as a material having a low absorption loss with respect to light in this wavelength region.

In a case where the wavelength of the light 40 from the imaging object is in a near-infrared region having longer wavelengths than the above case among near-infrared regions, specifically, in a wavelength band adjacent to 1.3 μm or a wavelength band adjacent to 1.55 μm, which is a wavelength region for optical communication, indium phosphide (InP) or the like can also be adopted as with the materials described above.

In a case where the microscopic structures 43b is formed on the microscopic structure support substrate 43a by an adhesive method, an application method or the like through pasting or application, a polyimide resin such as fluorinated polyimide, a light curing resin such as a UV epoxy resin, an acrylic resin such as polymethylmethacrylate (PMMA), a light curing organic material such as photoresist, or an organic material such as benzocyclobutene (BCB), can be preferably adopted as the material of the microscopic structures 43b.

Likewise, a typical inorganic glass material, silicon dioxide ($SiO_2$), air or the like is preferably adopted as the material of the structures around the microscopic structures 43b, and the material of the microscopic structure support substrate 43a. Any of these material can be selected without specific limitation, only if the refractive index is lower than the refractive index of the material of the microscopic structures 43b and exhibits a small absorption loss with respect to the wavelength of the light 40 from the imaging object. The sectional shape of the microscopic structure 43b is not limited to a columnar one. Alternatively, a hollow quadrangle, a cross, a circle, a hollow circle or the like can be adopted. Any of these shapes can provide polarization dependency according to the shape without losing the function as an optical waveguide that exerts a phase delay effect, described later.

Next, the operation of the image-pickup unit is described. As described later, the wavefront control element 43 has a function of utilizing the phase delay effect occurring in the microscopic structures 43b when the light 40 from the imaging object enters the microscopic structures 43b to thereby separating the light 40 from the imaging object having entered the wavefront control element 43 into first polarized light having a first polarization direction and a second polarized light having a second polarization direction orthogonal to the first polarization direction, to determine the traveling directions according to the first polarization direction (the direction parallel to the sheet of FIG. 4) and the second polarization direction (the direction perpendicular to the sheet of FIG. 4), and to form images of the first polarized light and the second polarized light at different positions on the pixel array 42. Here, the phase delay effect occurring at the microscopic structures 43b depends on the polarization direction of the light 40 from the imaging object, and on the shapes and/or dimensions of the microscopic structures 43b.

Between the wavefront control element 43 and the pixel array 42a in FIG. 4, the first polarized light travels along solid lines and imaged on the pixel array 42, and the second polarized light travels along broken lines and imaged on the pixel array 42. Their image formation positions are different from each other. That is, in the embodiment of the present invention, the light fluxes of the light 40 from the imaging object are separated into two polarized light beams orthogonal to each other, by the wavefront control element 43 included in each image-pickup unit 43, the traveling directions are determined according to the respective polarization directions, and the beams are imaged at different positions on the pixel array 42a.

According to the operation, two polarization images having the polarization directions orthogonal to each other can be obtained per image-pickup unit, without reducing the total light quantity until the light 40 from the imaging object reaches the pixel array 42a. Setting of the predetermined first polarization direction for each wavefront control element 43 can simultaneously acquire polarization images corresponding to various polarization directions on the pixel array 42a. When polarized light imaged on the pixels configuring the pixel array 42a are input, a photoelectric conversion signal that is an electric signal according to the intensity of the polarized light input by the photoelectric conversion elements included in the respective pixels is output from the substrate 42b. Accordingly, for one image-pickup unit, two photoelectric conversion signals corresponding to the two polarized light beams in the light 40 from the imaging object can be simultaneously output.

Based on the photoelectric conversion signal acquired by the multiple image-pickup units, signal processing and an image rearrangement process according to the two-dimensional position of the image-pickup unit 43 in the image-pickup unit array 33 are applied to the multiple image signals generated by the signal processing unit 35, thereby allowing acquisition of each polarization image having a recovered resolution, for example.

The image-pickup unit array in the polarization imaging image-pickup system that is one embodiment of the present invention can obtain the polarization images by using the wavefront control element array 33a to make the light absorption loss small and separate and image polarized light, without using the light attenuating polarization filter. Consequently, in comparison with the conventional polarization imaging image-pickup system including the light attenuating polarization filter, the total quantity of light reaching the pixel array 33b can be increased, and the image-pickup sensitivity can be improved.

Furthermore, the configuration of the image-pickup unit array can reduce the aperture of each image-pickup unit (corresponding to the aperture of each lens of the microlens array 22) while keeping the aperture of the entire image-pickup unit array 33 with respect to the light 30 from the imaging object, and can significantly reduce the distance between the wavefront control element array 33a and the pixel array 33b, i.e., the focal length, accordingly. That is, the image-pickup unit array can achieve a smaller size than the conventional polarization imaging device. Reduction in the size of the aperture of one image-pickup unit increases the number of image-pickup units arranged in the image-pickup unit array 33 accordingly.

Furthermore, each image-pickup unit is an imaging optical system that has a small focal length, which increases the depth of field. Accordingly, the unit is resistant to being affected by the magnitude of distance between an imaging object 31 and the image-pickup unit array 33, and front and back foci of the imaging object 31 tend to be simultaneously achieved. That is, the image-pickup unit array 33 does not specifically require a focus adjustment mechanism with respect to the imaging object 31.

The image-pickup unit array 33 can perform polarization imaging only by the configuration that includes one layer of wavefront control element array 33a, and the pixel array 33b that is an image sensor. Accordingly, technical characteristics that have a higher productivity, and a smaller number of components than the conventional polarization imaging devices disclosed in Non-Patent Literatures 1 and 2. Consequently, a polarization imaging device having lower cost can be realized.

Furthermore, the polarization imaging image-pickup system of the present invention uses the difference in the angles of light fluxes of the light 30 from the imaging object, which are different according to the two-dimensional position of each image-pickup unit in each image-pickup unit array 33, and processes the image signal generated by the signal processing unit 35, using the image reconstruction algorithm, thereby allowing acquisition of the distance information between the image-pickup unit array 33 and the imaging object 31 and of refocusing. Consequently, the polarization imaging image-pickup system of the one embodiment of the present invention can simultaneously generate images that have predetermined polarization information in the light 30 from the imaging object and distance information from the imaging object 31.

First Embodiment

The configuration of a polarization imaging image-pickup system according to a first embodiment is schematically described.

Figure 5A:
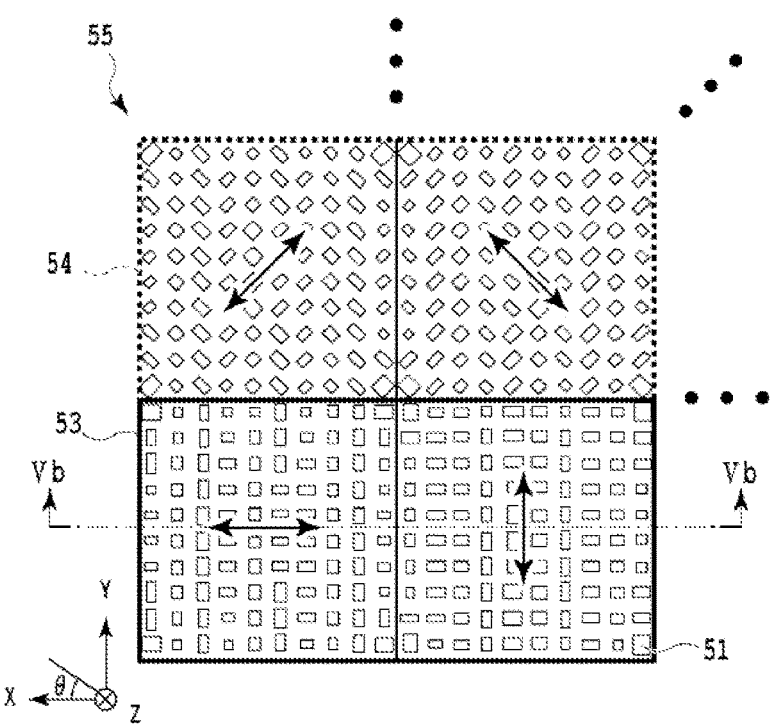
FIG. 5 is a schematic diagram showing a configuration of a polarization imaging image-pickup system according to a first embodiment.
Figure 5B:
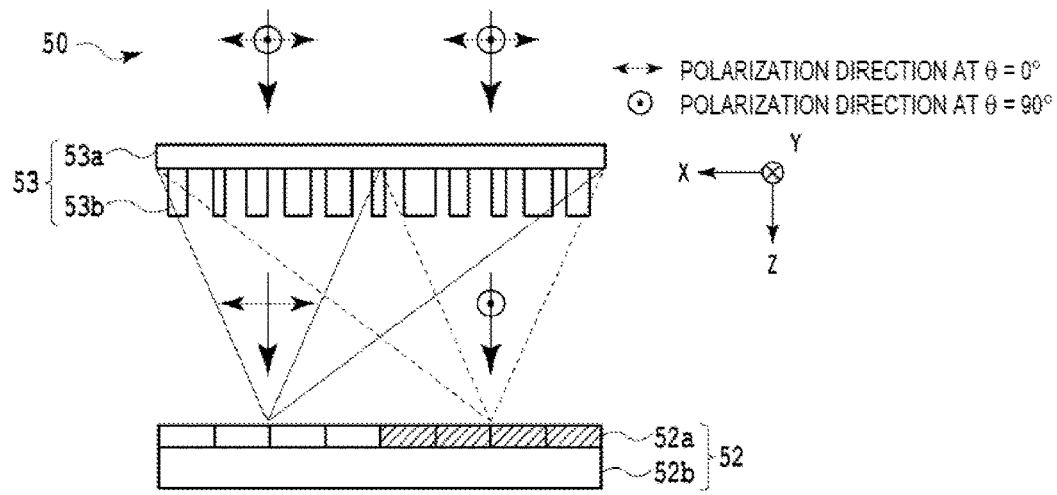

FIG. 5 is a schematic diagram showing the configuration of the polarization imaging image-pickup system according to the first embodiment. FIG. 5(a) is a part of a top view of an image-pickup unit array 55. FIG. 5(b) is a side sectional view of the image-pickup unit array 55 taken along Vb-Vb.

As shown in FIG. 5(b), a wavefront control element array 53 where multiple wavefront control elements are two-dimensionally arranged, is arranged above, so as to face, the pixel array 52a where multiple pixels including photoelectric conversion elements are two-dimensionally arranged. The image-pickup unit arrays 55 are further two-dimensionally arranged in a continuous manner. The image-pickup unit array 55 in FIG. 5(a) is a part thereof.

The section of the wavefront control elements 53 in FIG. 5(b) is a section of a first wavefront control element 53 that is one wavefront control element. That is, FIG. 5(b) is a sectional view of the one image-pickup unit.

The top view of the image-pickup unit array 55 in FIG. 5(a) shows the microscopic structures 53b arranged on the microscopic structure support substrate 53a, virtually through the microscopic structure support substrate 53a. In FIG. 5(b), the microscopic structures 53b are provided perpendicularly on the microscopic structure support substrate 53a of the first wavefront control element 53. The microscopic structures 53b each have a columnar shape, and a constant height.

In the following description, a right-handed xyz orthogonal coordinate system is configured, assuming that the normal direction of the pixel array 52a is the z axis, and horizontal directions parallel to the pixel array 52a is the x axis and the y axis. On the xy plane, the angle with the x axis after rotation in the y-axis direction around the z axis from the x axis is assumed as θ.

In this embodiment, as shown in FIG. 5, the wavefront control element array constituting the image-pickup unit array 55 includes: the first wavefront control element 53 that separates the light 50 from the imaging object in polarization directions parallel to the x-axis direction and the y-axis direction, and forms images on the pixel array 52a; and a second wavefront control element 54 that separates the light 50 from the imaging object in polarization directions parallel to the direction at θ=45° and the direction at θ=135°, and forms images on the pixel array. In this embodiment, the first wavefront control element 53 and the second wavefront control element 54 are arranged adjacent to each other on a plane parallel to the xy plane along the y-axis direction. That is, the image-pickup unit array 55 includes adjoining two image-pickup units. The first wavefront control element 53 and the second wavefront control element 54 are arranged alternately along the y-axis direction.

The first wavefront control element 53 and the second wavefront control element 54 have upper surfaces that have rectangular shapes, and have areas identical to each other. Here, preferably, the shapes of the upper surfaces of the wavefront control elements 53 and 54 are rectangles, and the ratio between the orthogonal two sides, that is, the aspect ratio that is the ratio of a long side of the rectangle to a short side is higher than one. For example, the aspect ratio may be an aspect ratio of a typically used two-dimensional image, such as 4:3, 16:9 or the like.

The forms of the arrangement, the shape, the size or the like of the wavefront control element are not limited to the example in FIG. 5. Various forms may be appropriately adopted. For example, the first wavefront control element 53 and the second wavefront control element 54 can be arranged alternately along the x-axis direction and the y-axis direction, and can be arranged so as to form what is called a checkered pattern. A configuration can be adopted where the first wavefront control elements 53 and the second wavefront control elements 54 are one-dimensionally or two-dimensionally, randomly arranged without regularity. That is, the same applies to the arrangement, shape, size and the like of the image-pickup unit array that has a configuration of including one wavefront control element.

Preferably, the numbers of two types of wavefront control elements that separate the light 50 from the imaging object in the different polarization directions, that is, the numbers of first wavefront control elements 53 and second wavefront control elements 54 included in the image-pickup unit array 55 are the same as each other. This is because the resolutions of multiple polarization images having different polarization directions should be configured to be the same.

Furthermore, the number of types of wavefront control elements constituting the image-pickup element array 55 is not limited to two as in this embodiment. Alternatively, the number may be N (N is a natural number of two or more). In this case, the mode of arrangement of the N types of wavefront control elements, the shapes, sizes or the like thereof may appropriately have various forms, in a manner similar to that of the example in the case of the two types in this embodiment. Preferably, the numbers of wavefront control elements of different types included in the image-pickup element array 55 are the same, as with the case of the two types.

The operation of each configuration element of the polarization imaging image-pickup system according to this embodiment is described.

The light 50 from the imaging object entering the polarization imaging image-pickup system is separated in the x-axis direction and the y-axis direction orthogonal thereto by the first wavefront control element 53, and is separated in the direction at θ=45° and the direction at θ=135° orthogonal thereto by the second wavefront control element 54, in each image-pickup unit. Next, images of the separated polarized light are formed at corresponding positions different from each other on the pixel array 52*a*.

Consequently, if two image-pickup units that are an image-pickup unit including the first wavefront control element 53 and an image-pickup unit including the second wavefront control element 54 are assumed as "one set of image-pickup units", four polarization images made of polarized light in the x-axis direction (θ=0°), the y-axis direction (θ=90°), the direction at θ=45°, and the direction at θ=135° can be generated per set of image-pickup units. That is, in this embodiment, multiple image-pickup units are two-dimensionally arranged. Accordingly, the polarization images corresponding to the respective polarization directions can be generated; the number of these images is twice as many as the number of image-pickup units included in the image-pickup unit array.

The polarization directions for separation are not limited to those in the case of this embodiment. Appropriate setting of configurations of the wavefront control elements 53 and 54 can freely change the polarization directions in which the light 50 from the imaging object is separated.

Next, the polarization images generated on the pixel array 52*a* are photoelectrically converted by the photoelectric conversion elements in the respective pixels in the pixel array 52*a*, and multiple photoelectric conversion signals corresponding to the respective polarization directions are output from the entire substrate 52*b* on which the pixel array 52*a* is arranged. In the signal processing unit 35, based on the photoelectric conversion signals output from the pixel array 52*b*, the image signals corresponding to the respective polarization directions are generated. Images generated from the image signals are defined according to the number of pixels included in the image-pickup unit. Accordingly, the resolution of the image becomes low according to the size of the image-pickup unit in some cases.

Here, in this embodiment, these photoelectric conversion signals are subjected to image processing means, such as an image reconstruction algorithm (Non-Patent Literature 2) that applies signal processing using two-dimensional position information on the pixel array in the image-pickup unit array 55 (in consideration of the effect of parallax), thereby allowing significant recovery of the resolution of the polarization image. Such a process of recovering the resolution of the image (hereinafter called a resolution recovery process) is applied to the photoelectric conversion signals input into the signal processing unit 35, thereby allowing generation with the four polarization image resolutions made of polarized light beams in the x-axis direction (θ=0°), the y-axis direction (θ=90°), the direction at θ=45°, and the direction at θ=135°, in the case of the example in FIG. 5.

In this embodiment, from the polarization images corresponding to the four polarization directions, pieces of two-dimensional information on three parameters among four Stokes parameters that represent the polarization states of the light 50 from the imaging object can be simultaneously obtained. As a result, a light intensity image, a polarization direction image, and a polarization degree image can be simultaneously obtained. Furthermore, in this embodiment, two-dimensional position information on each image-pickup unit in the image-pickup unit array is used while the resolution recovery process is performed, and parallax information on the imaging object can be obtained. Consequently, in addition to each polarization image with a recovered resolution, distance information between the imaging object and the image-pickup unit array can be calculated.

Hereinafter, the wavefront control elements 53 and 54 in this embodiment are described.

The wavefront control elements 53 and 54 in this embodiment include multiple microscopic structures 53*b* provided vertically on half a surface of the microscopic structure support substrate 53*a*. These microscopic structures 53*b* are arranged so as to form a pattern. The pattern formed by the microscopic structures 53*b* may be a pattern formed by one or more columnar microscopic structures 53*b*, or a pattern formed by one or more porous microscopic structures 53*b*.

Here, in a case of adopting a pattern formed by multiple microscopic structures 53*b* having different shapes, it is preferable that the intervals between the microscopic structures 53*b* be shorter than the wavelength of the light 50 from the imaging object in order to suppress occurrence of unnecessary optical diffraction in the wavefront control elements 53 and 54.

Hereinafter, as a specific example of the wavefront control elements 53 and 54, a case of including a pattern formed by multiple columnar microscopic structures 60 is described.

FIG. 6 is a schematic diagram of the columnar microscopic structures 60 arranged on the wavefront control elements 53 and 54. FIG. 6(*a*) shows a top view of the columnar microscopic structure 60. FIGS. 6(*b*) and 6(*c*) show side views of the columnar microscopic structure 60 on the x plane. FIG. 6(*b*) shows a case where the polarization direction of light beam 60*a* from an imaging object is perpendicular to the sheet. FIG. 6(*c*) shows a case where the polarization direction of light beam 60*b* from the imaging object is parallel to the sheet.

The microscopic structures 60 is formed of a material having a refractive index $n_1$ higher than a refractive index $n_0$ of the material or space around the microscopic structures 60. The height h of each microscopic structure 60 is constant. Each of the shapes of the bottom surfaces and the upper surfaces of the microscopic structures 60 is a rectangle with sides having lengths of $W_1$ and $W_2$.

The microscopic structures 60 can function as optical waveguides that confine light beams 60*a* and 60*b* from the imaging object within the microscopic structures 60 and allow the light beams to propagate, by the difference in refractive index from the material or space around the microscopic structures 60. Consequently, when the light beams 60*a* and 60*b* from the imaging object are incident on one surface of each microscopic structure 60 in the xy plane, the light beams 60*a* and 60*b* from the imaging object propagate in the y-axis direction while being confined in the microscopic structures 60. At this time, the light beams 60*a* and 60*b* from the imaging object having entered the microscopic structures 60 propagate over the length of the height h while being subjected to the phase delay effect defined by the optical waveguides' effective refractive index (hereinafter called the effective refractive index) $n_{\mathit{eff}}$, and are then emitted from the other surface of each microscopic structure 60.

In this case, with reference to the phase of the light having propagated in the materials or space around the microscopic structures 60 over the length of the height h of the microscopic structures 60, the phase delay amount φ of the light beams 60*a* and 60*b* from the imaging object occurring during propagation in the microscopic structures 60 is represented by the following Formula (1), with wavelength of the light beams 60*a* and 60*b* from the imaging object in a vacuum being assumed as λ.

$$\phi = (n_{\mathit{eff}} - n_0) \times 2\pi h / \lambda \quad (1)$$

$n_{\mathit{eff}}$ is a function having the dimensions of the microscopic structures 60 as variables, and is known to have large polarization dependency according to the shapes of the microscopic structures 60. If the section of each microscopic structure 60 perpendicular to the propagation direction of the light beams 60*a* and 60*b* from the imaging object, that is, parallel to the xz plane, is a rectangle shown in FIG. 6(*a*), $n_{\mathit{eff}}$ different with respect to the mutually orthogonal polarization directions of the light beams 60*a* and 60*b* from the imaging object can be provided for the light beams 60*a* and 60*b* from the imaging object.

Here, the phase delay amount with respect to the polarization direction of the light beam 60*a* from the imaging object, which is longitudinally polarized light, is assumed as $\phi_1$. The phase delay amount with respect to the polarization direction of the light beam 60*b* from the imaging object, which is transversely polarized light, is assumed as $\phi_2$. The effective refractive index with respect to the polarization direction of the light beam 60*a* from the imaging object, which is longitudinally polarized light, is assumed as $n_{\mathit{eff}1}$. The effective refractive index with respect to the polarization direction of the light beam 60*b* from the imaging object, which is transversely polarized light is assumed as $n_{\mathit{eff}2}$. The length of the side of the microscopic structure 60 in the direction parallel to the polarization direction of the light beam 60*a* from the imaging object, which is longitudinal polarization, is assumed as w 1. The length of the side in the polarization direction of the light beam 60*b* from the imaging object, which is the transversely polarized light, is assumed as w 2. In this case, it is known that $n_{\mathit{eff}1}$ and $n_{\mathit{eff}2}$ can be adjusted by a combination of w 1 and w 2. The adjustable value of $n_{\mathit{eff}1}$ is more than $n_0$ and less than $n_1$. The adjustable value of $n_{\mathit{eff}2}$ is more than $n_0$ and less than $n_1$. Consequently, according to Formula (1), $\phi_1$ and $\phi_2$ can be adjusted to predetermined values by the combination of $w_1$ and $w_2$. That is, setting of the lengths $w_1$ and $w_2$ of the sides of the columnar microscopic structure 60 shown in FIG. 6 can adjust the phase delay amount $\phi_1$ with respect to the polarization direction of the light beam 60*a* from the imaging object, which is longitudinally polarized light, and the phase delay amount $\phi_2$ with respect to the polarization direction of the light beam 60*b* from the imaging object, which is transversely polarized light, to predetermined values.

Based on the principle described above, the columnar microscopic structures 60 having the combination of lengths $W_1$ and $W_2$ of the sides of the predetermined sections are arranged on the microscopic structure support substrate 53*a* to form a two-dimensional pattern, thereby allowing the wavefront control elements 53 and 54 to provide a two-dimensional distribution with a predetermined phase delay amount with respect to the polarization directions of the light beams 60*a* and 60*b* from the imaging object, which are orthogonal to each other. As a result, predetermined wavefront control can be applied to the polarization directions of the light beam 60*a* and 60*b* from the imaging object, which are orthogonal to each other.

Here, preferably, to perform any wavefront control, the adjustable range of the phase delay amount with respect to each polarization direction due to the columnar structure has a range from 0 to 2π or more. In view of the fabrication method and fabrication cost, it is preferable that the height h of the microscopic structure 60 be as small as possible. Consequently, according to Formula (1), assuming that the wavelength of the light beams 60*a* and 60*b* from the imaging object is λ, it is preferable to set the height h of the microscopic structure 60 so as to approach $$h = \lambda / (n_1 - n_0) \quad (2)$$

FIG. 7 shows the correspondence relationship between a pattern formed by microscopic structures 51 arranged on the first wavefront control element 53 and the one-dimensional distribution of phase delay amounts of light 50 from the imaging object corresponding to the pattern. FIG. 7(*a*) is a top view of the first wavefront control element 53 in FIG. 5(*a*). FIG. 7(*b*) is a graph showing the phase delay amounts of light 50 from the imaging object corresponding to the pattern formed by the microscopic structures 51 arranged on the first wavefront control element 53. The ordinate axis indicates the phase delay amount in the case of the first wavefront control element 53. The abscissa axis indicates coordinate in the x-axis direction passing through coordinates $(x_L, y_0)$ and coordinates $(x_R, y_0)$. Here, multiple columnar microscopic structures 51 are arranged in parallel to the x-axis and the y-axis directions, at intervals equal to or shorter than the wavelength of the light 50 from the imaging object. The definition of the coordinates and θ are similar to those in FIG. 5.

Figure 7A:
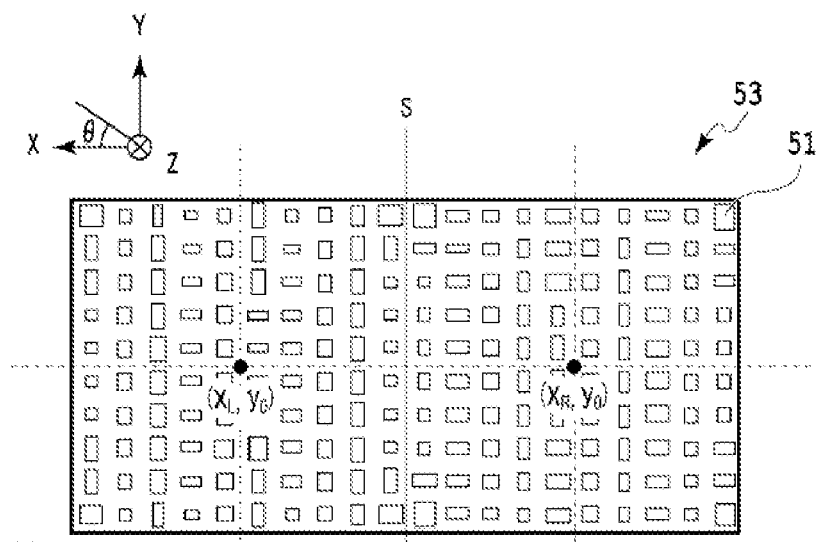
FIG. 7 shows the correspondence relationship between a pattern formed by microscopic structures 51 arranged on the first wavefront control element 53 and a one-dimensional distribution of phase delay amounts of light 50 from an imaging object corresponding to the pattern.

As shown in FIG. 7(a), the lengths w 1 and w 2 of the sides of the section of the columnar microscopic structure 51 are different according to the two-dimensional position on the first wavefront control element 53. According to the values of lengths of the sides w 1 and w 2 of the section of the columnar microscopic structure 51 determined by the two-dimensional position on the first wavefront control element 53, light having passed through the wavefront control element 53 has a two-dimensional distribution of phase delay amounts different with respect to the two polarization directions orthogonal to each other. Consequently, the wavefront control element 53 can provide optical wavefronts different with respect to the two polarized light beams orthogonal to each other in the light 50 from the imaging object. The traveling direction of the light 50 from the imaging object is determined by the optical wavefronts. Accordingly, the two polarized light beams in the light 50 from the imaging object having passed through the wavefront control element 53 can be spatially separated and allowed to travel. Furthermore, the wavefront control element 53 causes the two-dimensional distribution of the phase delay amounts of the light from the imaging object having passed through the wavefront control element 53 to be a distribution of imaging at positions different with respect to the polarization directions. Accordingly, the two polarized light beams in the light 50 from the imaging object having passed through the wavefront control element 53 can be spatially separated and imaged at two different positions on the pixel array 52a.

The principle of imaging at the different positions on the pixel array 52a with respect to the polarization directions is described with reference to FIG. 7(b). In FIG. 7(a), the region on the upper surface of the wavefront control element 53 on the left side region of the sheet, that is, the region on the left side of the sheet divided by line S. The region of the upper surface of the wavefront control element 53 on the left side of the sheet is a region where the light in the polarization direction of θ=0° is collected and imaged at a location corresponding to the coordinates $(x_L, y_0)$ on the pixel array 52a. Here, the multiple microscopic structures 51 provided in the region on the left side of the sheet on the upper surface of the wavefront control element 53 are provided, with the dimensions and arrangement direction being adjusted, such that the phase delay amount at the position of coordinates $(x_L, y_0)$ when the light 50 from the imaging object enters the region indicates the maximum and the phase delay amount monotonously decreases as the position is apart from the coordinates.

Likewise, in FIG. 7(a), in the right region of the sheet on the upper surface of the wavefront control element 53, that is, the right region of the sheet divided by line S, multiple microscopic structures 51 are provided such that the light in the polarization direction at θ=90° is collected and imaged at a location corresponding to coordinates $(x_R, y_0)$ on the pixel array 52a.

That is, the wavefront control element 53 in this embodiment has a function of spatially separating the two polarized light beams orthogonal to each other in the light 50 from the imaging object corresponding to the pattern formed of the microscopic structures 51, and of imaging the two polarized light beams at two different positions on the pixel array 52a.

Figure 7B:
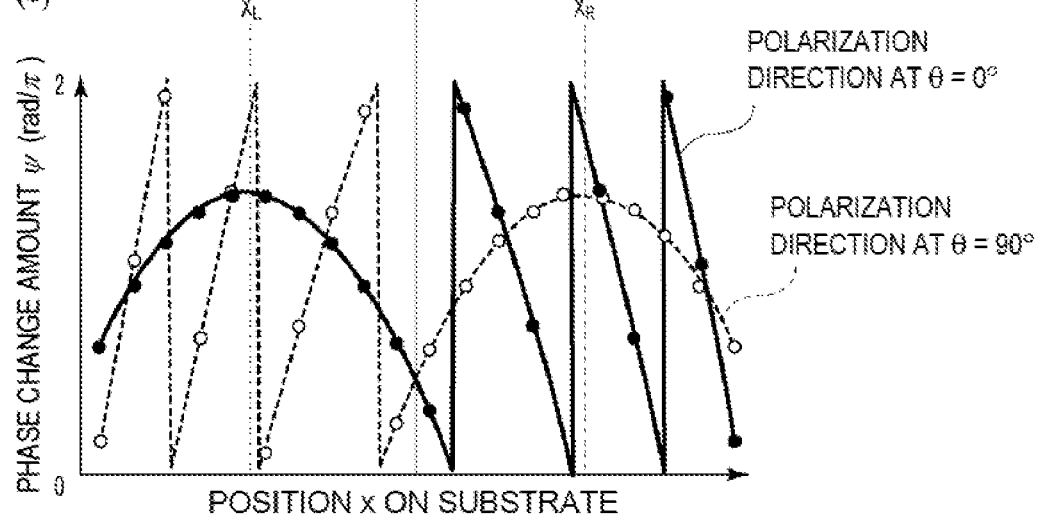

For example, when the wavefront control element 53 has a pattern formed of the microscopic structures 51 shown in FIG. 7(a), the wavefront control element 53 can provide a two-dimensional distribution of phase delay amounts different with respect to the polarized light in the x-axis direction and the polarized light in the y-axis direction in the light 50 from the imaging object, as shown in FIG. 7(b).

For description in further detail, the pattern formed of the multiple microscopic structures 51 arranged on the wavefront control element 53 shown in FIG. 7(a) are symmetric to a certain extent with respect to the line segment connecting the coordinates $(x_L, y_0)$ and coordinates $(x_R, y_0)$ and line S that is orthogonal to the line segment and passes through the midpoint between the two coordinates as a boundary. Specifically, with reference to a certain region on the wavefront control element 53 divided by line S as a boundary, an operation of rotating the sections of all the microscopic structures 51 included in the region by θ=90° without changing the two-dimensional position causes the pattern in the region as the reference to be the same as the pattern in the other region.

The pattern formed of the multiple microscopic structures 51 arranged on the wavefront control element 53 shown in FIG. 7(a) provides the two-dimensional distribution of phase delay amounts similar to that of an off-axis lens that ideally collects the light 50 from the imaging object at the position of the coordinates $(x_L, y_0)$, for the polarized light in the x-axis direction in the light 50 from the imaging object. Likewise, the polarized light in the y-axis direction in the light 50 from the imaging object is provided with the two-dimensional distribution of phase delay amounts similar to that of the off-axis lens that ideally collects the light 50 from the imaging object at the position of coordinates $(x_R, y_0)$. In this case, the polarized light in the x-axis direction in the light 50 from the imaging object is collected centered at the position of coordinates $(x_L, y_0)$ on the imaging plane on the pixel array 52a, and the polarized light in the y-axis direction in the light 50 from the imaging object is collected centered at the position of coordinates $(x_R, y_0)$ on the imaging plane on the pixel array 52a. That is, the wavefront control element 53 can spatially separate the two polarized light beams orthogonal to each other in the light 50 from the imaging object and images them at different positions on the pixel array 52a.

Figure 8A:
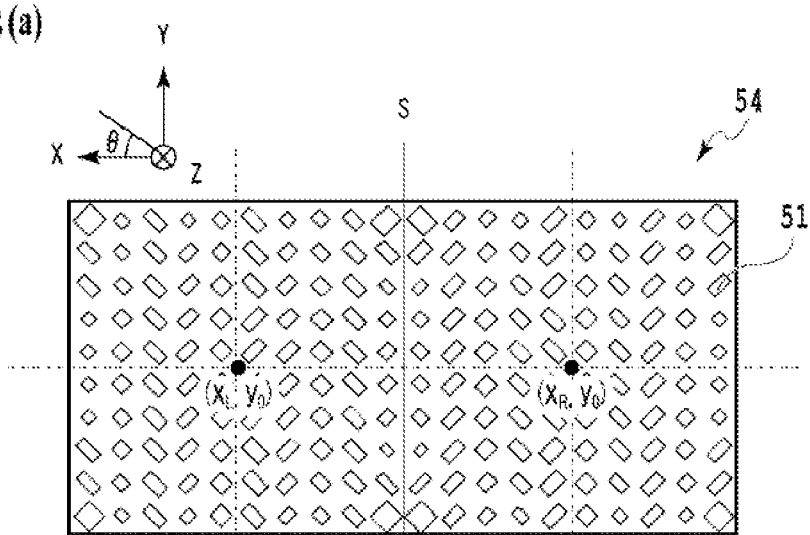
FIG. 8 shows the correspondence relationship between a pattern formed by microscopic structures 51 arranged on the second wavefront control element 54 and a one-dimensional distribution of phase delay amounts of the light 50 from the imaging object corresponding to the pattern.
Figure 8B:
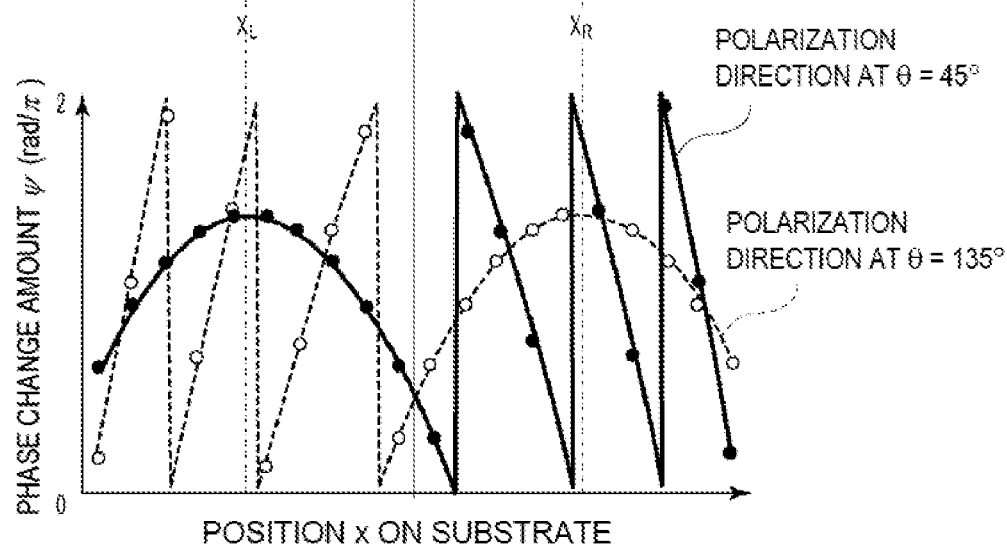

Note that the description of the function of the wavefront control element 53 shown in FIG. 7 is an example. Setting of the dimensions of the columnar microscopic structures 51 can adjust the combination of the separated polarization directions and the image formation positions of separated polarized light beams to be in a certain manner. For example, as shown in FIG. 8, in a case where the pattern formed of the multiple microscopic structures 51 arranged in the wavefront control element 53 in FIG. 7(a) is rotated by 45° on the xy plane (that is, a case where the pattern formed in the second wavefront control element 54 in FIG. 5(a)), the polarized light in the direction at θ=45° in the light 50 from the imaging object is imaged centered at the position of the coordinates $(x_L, y_0)$ on the imaging plane on the pixel array 52a, and the polarized light in the direction at θ=135° in the light 50 from the imaging object is imaged centered at the position of the coordinates $(x_R, y_0)$ on the imaging plane on the pixel array 52a.

Consequently, a set of image-pickup units included adjacent to the wavefront control elements 53 and 54 is configured, the set of image-pickup units is two-dimensionally continuously arranged in the image-pickup unit array 55, and the image-pickup unit array is configured by arrangement allowing the image-pickup unit array 55 to face the pixel array 52a, thus allowing the four polarization images to be generated at a high resolution as described above, the polarization images being made up of polarized light beams in the x-axis direction (θ=0°), the y-axis direction (θ=90°), the direction at θ=45° and the direction at θ=135° with respect to the light 50 from the imaging object.

The wavefront control elements 53 and 54 in this embodiment have little light absorption with respect to the light 50 from the imaging object by the microscopic structure support substrate 53a and the microscopic structures 53b. Since, the microscopic structures 53b are arranged at intervals smaller than the wavelength of the light 50 from the imaging object, unnecessary optical diffraction does not occur. Furthermore, appropriate setting of the shapes of the microscopic structures 53b matches the impedances of the microscopic structures 53b and the microscopic structure support substrate 53a, thereby allowing the reflection of light between the microscopic structures 53b and the microscopic structure support substrate 53a to be suppressed. Consequently, the light 50 from the imaging object is separated into multiple polarized light beams by the wavefront control elements 53 and 54 with losing little power, and the separated polarized light beams are each imaged on the pixel array 52a. Consequently, when multiple polarization images are generated using the wavefront control elements 53 and 54, the light use efficiency is high, and a light use efficiency close to 100% can be achieved in principle.

The wavefront control elements 53 and 54 having the polarization separation function and the imaging function in this embodiment can be fabricated by thin film lamination means and patterning means used in a publicly known semiconductor manufacturing technique. The wavefront control elements 53 and 54 in this embodiment have the pattern formed by the constant microscopic structure 53a having the constant height. Accordingly, the possibility of easy fabrication at low cost is high. The wavefront control elements 53 and 54 themselves serve as the imaging optical system and the polarization separation optical system at the same time. Accordingly, the number of components is smaller and the implementation cost is lower than those in the conventional art.

First Modified Example of First Embodiment

The polarization image-pickup system capable of simultaneously generating four pieces of polarization information has been described above in detail. Hereinafter, a modified example capable of also acquiring rotation direction information of circularly polarized light is described in addition to the example described above.

As described above, appropriate setting of the configuration of the wavefront control element can perform predetermined wavefront control to the polarized light in the predetermined direction and the direction orthogonal thereto. It has been known that this concept can be extended to wavefront control according to the rotation direction of circularly polarized light, by generalizing a Jones matrix. That is, appropriate setting of the configuration of the wavefront control element in this embodiment can achieve separation between the right-handed circularly polarized light beam and the left-handed circularly polarized light beam, and imaging the separated polarized light beams.

Figure 9:
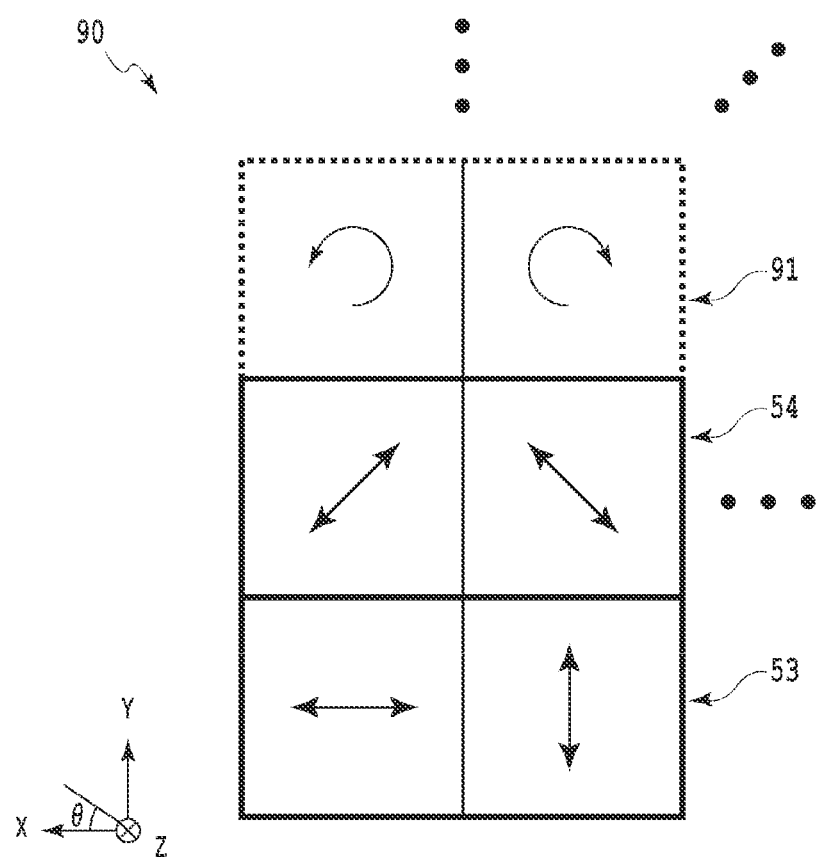
FIG. 9 is a schematic top view of a set of image-pickup units made up of three image-pickup units including an image-pickup unit capable of separating polarized light with respect to each rotation direction of circularly polarized light.

FIG. 9 is schematic top view of a set of image-pickup units made up of three image-pickup units including an image-pickup unit capable of separating polarized light with respect to each rotation direction of circularly polarized light. An image-pickup unit array 90 includes not only the first wavefront control element 53 and the second wavefront control element 54 as shown in FIG. 5(a) but also a third wavefront control element 91. The image-pickup unit array 90 has this configuration as a set of image-pickup units that are two-dimensionally continuous.

Each image-pickup unit is arranged as shown in FIG. 9 to achieve the three image-pickup units that include the image-pickup unit including the first wavefront control element 53, the image-pickup unit including the second wavefront control element 54, and the image-pickup unit including the second wavefront control element 91, as "one set of image-pickup units", thereby allowing generation of six polarization images per set of image-pickup unit, these images including the x-axis direction (θ=0°), the y-axis direction (θ=90°), the direction at θ=45°, the direction at θ=135°, the right-handed circularly polarized light direction, and the left-handed circularly polarized light direction. That is, in the first modified example of this embodiment, multiple image-pickup units are two-dimensionally arranged. Accordingly, the polarization images corresponding to the respective polarization directions can be generated; the number of these images is twice as many as the number of image-pickup units included in the image-pickup unit array 90.

From the polarization images corresponding to the six polarization directions, two-dimensional information can be obtained on all the four Stokes parameters representing the polarization states of the light 50 from the imaging object, thereby allowing all the polarization characteristics of the imaging object to be simultaneously acquired.

Second Modified Example of First Embodiment

Next, a modified example capable of reducing overlapping (hereinafter called crosstalk) of polarization images on the pixel array 52a is described.

FIG. 10 is a schematic diagram showing difference in crosstalk suppression before and after installation of barriers 101 in a configuration of an image-pickup unit array 55 shown in FIG. 5 when multiple polarization images are generated by the configuration of the image-pickup unit array 55. FIG. 10(a) is a top view of the image-pickup unit array 55 that includes the first wavefront control element 53 and the second wavefront control element 54. FIG. 10(b) is a side sectional view of the image-pickup unit array 55 taken along Xb-Xb in FIG. 10(a). FIG. 10(c) is a top view of the configuration where barriers 101 are further provided for the image-pickup unit array 55. FIG. 10(d) is a side sectional view of the image-pickup unit array 55 including the barriers 101 taken along Xd-Xd in FIG. 10(c).

As shown in FIG. 10(a), in the adjoining image-pickup units and 54, crosstalk sometimes occurs around boundaries of multiple polarization images imaged on the pixel array 52a. The crosstalk possibly causes degradation in the reconstructed image, and reduction in the polarization extinction ratio (the intensity of the polarized light in a desired direction/the intensity of the polarized light in the other directions). The configuration of the image-pickup unit array 55 in the second modified example of this embodiment is the configuration where the barriers 101 are provided at the boundaries of adjoining image-pickup units in order to prevent the crosstalk. As shown in FIG. 10(d), the barriers 101 are positioned between the first wavefront control element 53 and the second wavefront control element 54 and the pixel array 52a, and are provided so as to be substantially perpendicular to the first wavefront control element 53, the second wavefront control element 54 and the pixel array 52a.

Preferably, the barriers 101 are components that are formed of a material that absorbs light 100 from an imaging object and causes no stray light, or have been subjected to surface treatment so as to have a function similar thereto. If the overlapping between the light fluxes of polarized light beams separated by the wavefront control elements 53 and 54 included in the adjoining image-pickup units is completely blocked by the barriers 101, crosstalk between the polarization images generated by the adjoining image-pickup units can be completely removed. Even with barriers that are partial and cannot completely block overlapping between the light fluxes of polarized light beams separated by the wavefront control elements included in the adjoining image-pickup units, for example, barriers having low heights, the heights and positions of the barriers 101 may be determined according to the application, the fabrication process, or the implementation process only if an advantageous effect of reducing the adverse effects of crosstalk is provided.

Second Embodiment

Next, a second embodiment of the present invention is described. This embodiment exemplifies the configuration and operation of an image-pickup unit array 55 also including a polarization filter array 111.

Figure 11A:
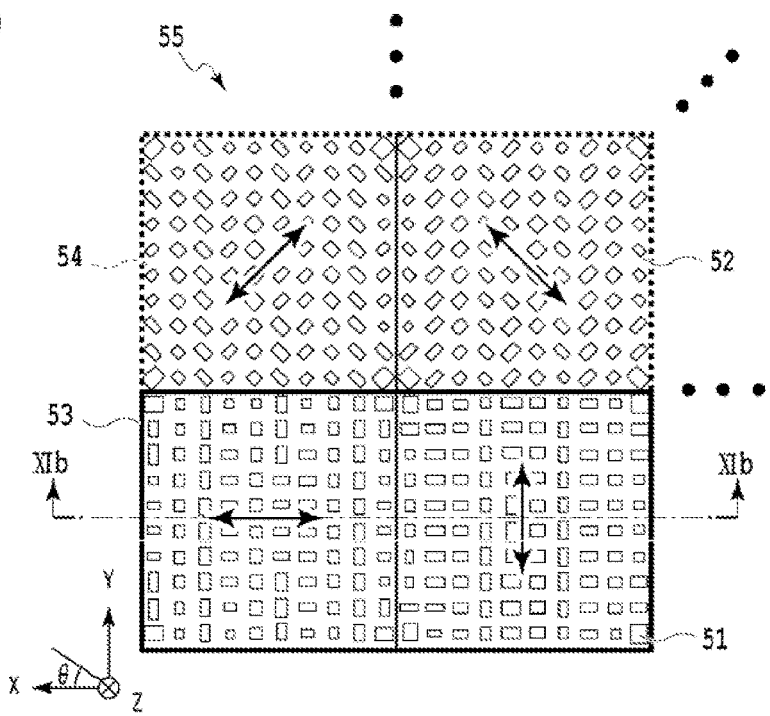
FIG. 11 is a schematic diagram showing a configuration of an image-pickup unit array 55 applied to a polarization imaging image-pickup system according to a second embodiment of the present invention.
Figure 11B:
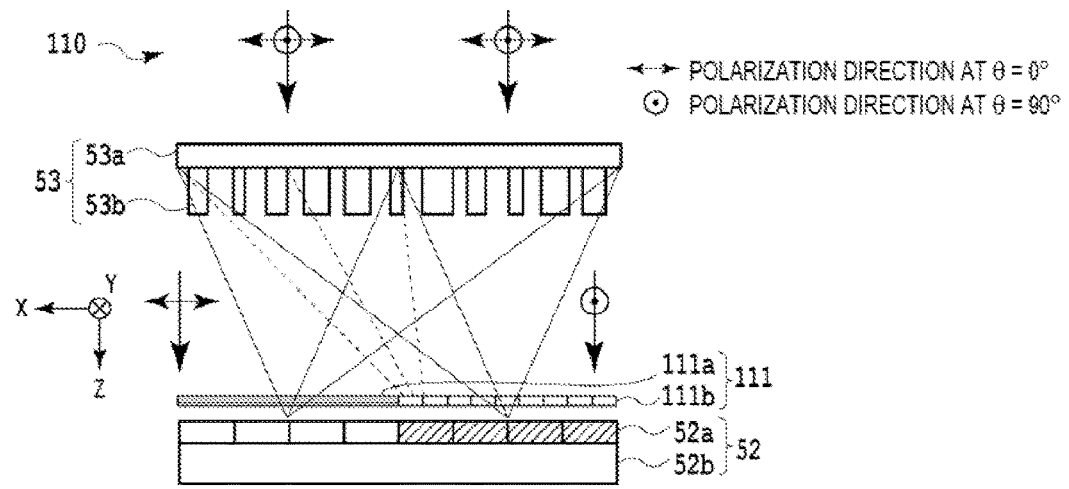

FIG. 11 is a schematic diagram showing the configuration of the image-pickup unit array 55 applied to a polarization imaging image-pickup system according to the second embodiment of the present invention. FIG. 11(a) is a part of a top view of the image-pickup unit array 55. FIG. 11(b) shows a side sectional view of the image-pickup unit array 55 taken along XIb-XIb in FIG. 11(a).

As shown in FIG. 11(b), in the configuration of the image-pickup unit array 55 in this embodiment, the polarization filter array 111 is further arranged above the pixel array 52a, with reference to the configuration of the image-pickup unit array 55 in the first embodiment. For each image-pickup unit that includes one wavefront control element 53 and multiple pixels on the pixel array 52a corresponding thereto, two polarization filters 111a and 111b with transmission axes orthogonal to each other are arranged. The two polarization filters 111a and 111b are arranged corresponding to the image formation positions of the two polarized light beams separated by the wavefront control element 53.

The polarization filter array 111 includes metal wire grids and photonic crystals, and can be achieved by a publicly known technique.

In this embodiment, the configuration elements other than the polarization filter array 111 are the same as those in the first embodiment.

In this embodiment, each polarized light beam separated from light 110 from an imaging object by the wavefront control element 53 necessarily passes through the polarization filter 111a or 111b corresponding to the polarization direction. Subsequently, each polarized light beam is imaged on the pixel array 52a. The polarization filter array 111 is arranged such that the polarization directions of the separated polarized light beams can coincide with the polarized light transmission axes of the polarization filters 111a and 111b corresponding to the respective polarization directions.

In this embodiment, the configuration of the image-pickup unit array 55 is the configuration described above, which can achieve the functions similar to those in the first embodiment, and can exert two new advantageous effects.

The first advantageous effect is an advantageous effect of significantly reducing the adverse effects due to crosstalk in the image-pickup unit array 55. In the first embodiment, crosstalk sometimes occurs around the boundary between two images including the respective polarized light beams imaged at different positions on the pixel array 52a in one image-pickup unit. On the contrary, in a case of the configuration further including the polarization filters 111a and 111b in one image-pickup unit in this embodiment, as shown in FIG. 11(b), components other than the polarized light in the desired direction are cut off and the light reaches the pixel array 52a. Accordingly, the crosstalk between the two polarization images imaged in one image-pickup unit in a separated manner can be completely removed.

The second advantageous effect is an advantageous effect of improving the polarization extinction ratio of the two polarization images in one image-pickup unit. In the case of the first embodiment, due to the adverse effects by the configuration of the wavefront control element 53 or the dimension error occurring during fabrication of the wavefront control element 53, the polarization extinction ratio of the separated polarized light beams is sometimes incapable of being sufficiently secured during separation of the polarized light beam in the predetermined direction from the light 110 from the imaging object. On the contrary, in the case of the configuration where the polarization filters 111a and 111b are further included in one image-pickup unit, polarization filtering is performed twice by the wavefront control element 53 and the polarization filter array 111. Accordingly, the polarization extinction ratio of the separated polarized light beams can be improved.

In the configuration where the polarization filters 111a and 111b are further included in one image-pickup unit, the advantageous effects described above can be exerted while maintaining the high light use efficiency. This is because the polarized light in the predetermined direction is separated by the wavefront control element 53 and then subsequently filtering is applied by the polarization filter array 111 to the separated polarized light, and thus the total quantity of light reaching the pixel array 52a is not practically reduced.

This embodiment can exert the first advantageous effect and the second advantageous effect, in addition to the advantageous effects exerted in the first embodiment. Modification similar to that of the first embodiment can be made.

Third Embodiment

Next, a third embodiment of the present invention is described. This embodiment exemplifies the configuration and operation of an image-pickup unit array also including a color filter array 121.

Figure 12A:
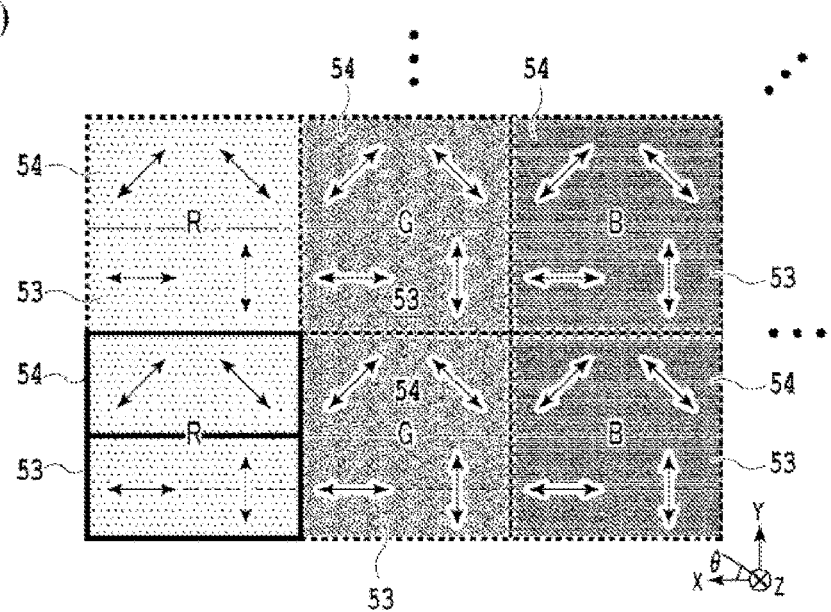
FIG. 12 is a schematic diagram showing a configuration of an image-pickup unit array applied to a polarization imaging image-pickup system according to a third embodiment of the present invention.
Figure 12B:
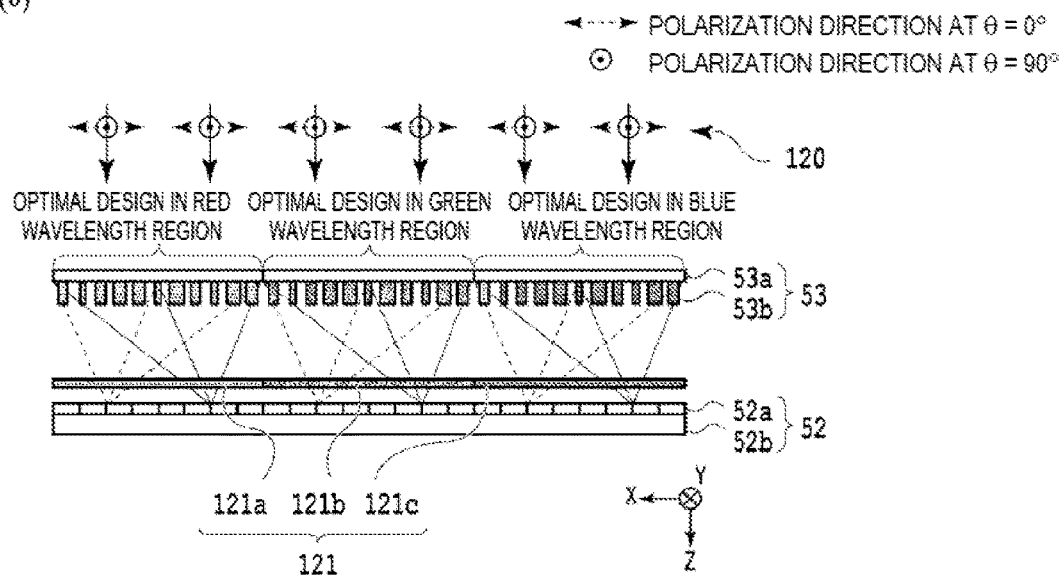

FIG. 12 is a schematic diagram showing the configuration of the image-pickup unit array applied to a polarization imaging image-pickup system according to the third embodiment of the present invention. FIG. 12(a) shows a part of a top view of the image-pickup unit array including the wavefront control elements 53 and 54. FIG. 12(b) shows a side sectional view of a part where the image-pickup units including the wavefront control elements 53 that are continuous along the x axis.

As shown in FIG. 12(b), in the configuration of the image-pickup unit array in this embodiment, the color filter array 121 is further arranged above the pixel array 52a, with reference to the configuration of the image-pickup unit array in the first embodiment. In this example, the color filter array 121 is arranged where three color filters 121a, 121b and 121c selectively transmit red (R), green (G) and blue (B), which are three primary colors in the visible light band, are coupled so as to face horizontally with the pixel array 52a. In this embodiment, the wavelength region of light 120 from an imaging object has no limitation, the number of types of adopted color filters and use band width have no limitation, and these can be appropriately set according to the object.

Figure 13:
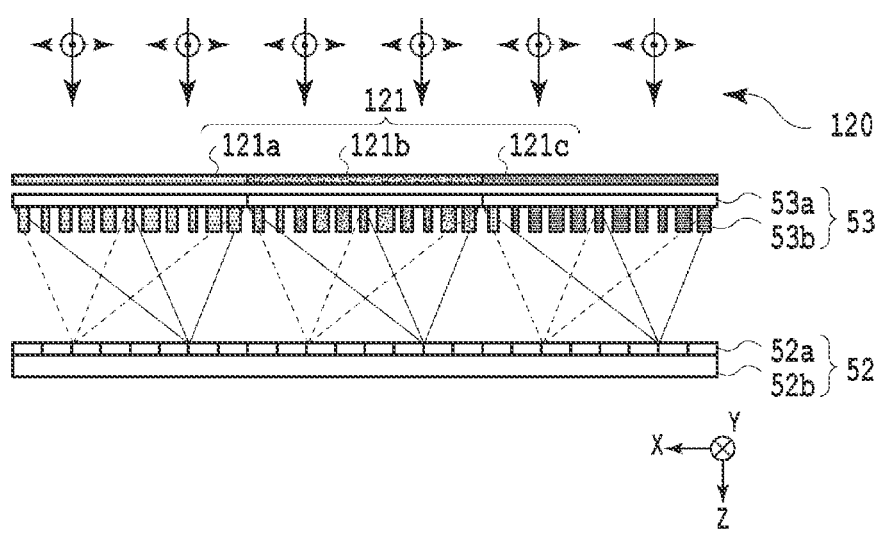
FIG. 13 is a schematic diagram showing another configuration of an image-pickup unit array applied to the polarization imaging image-pickup system according to the third embodiment of the present invention.

Furthermore, there is no limitation to the arrangement pattern of the color filters 121a, 121b and 121c in the color filter array 121 in the xy plane, i.e., the plane parallel to the pixel array 52a. For example, besides the arrangement pattern shown in FIG. 12(a), an arrangement similar to a Bayer arrangement adopted in a typical color image sensor can be adopted. The position where the color filter array 121 is arranged is not limited to that above the pixel array 52a. For example, as shown in FIG. 13, the array can be arranged above the wavefront control element 53.

The color filter array 121 is made of organic materials, inorganic materials, metal nanohole arrays or the like, and can be achieved by a publicly known technique.

As indicated by a rectangle drawn with solid lines in FIG. 12(a), the color filter array 121 is arranged such that any one type of color filter among the multiple (three in FIG. 12(a)) types of color filters 121a, 121b and 121c corresponds to a set of polarization image-pickup units each including one or more (two in FIG. 12(a)) image-pickup units. Furthermore, for the wavefront control elements 53 and 54 constituting each image-pickup unit, the two-dimensional distribution of phase delay amounts of the off-axis lens is designed using the transmission wavelength of the corresponding color filter 121a, 121b, 121c (see Formula (1)). Here, the focal length of the off-axis lens is configured so as to be the same among all the image-pickup units.

The image-pickup unit array in this embodiment includes the same configuration elements except the color filter array 121.

In this embodiment, one type of color filter among 121a, 121b and 121c is arranged for one set of image-pickup units. Consequently, a polarization image generated by each image-pickup unit is subjected to photoelectric conversion, after transmission necessarily through the color filter 121a, 121b, 121c corresponding to the image-pickup unit concerned. Here, the focal lengths of the wavefront control elements 53 and 54 constituting each image-pickup unit are designed so as to be the same among all the image-pickup units using the transmission wavelength of the corresponding color filter. Consequently, the polarization images generated by the respective image-pickup units have different wavelength regions, the same optical magnification, and little focus deviation.

Adoption of the image-pickup unit array in this embodiment can exert not only advantageous effects exerted in the first embodiment, but also an advantageous effect of reducing the adverse effects of the chromatic aberration in the imaging optical system.

In general, in an imaging optical system, the focal length is different according to the wavelength (color) of an incident light flux, thus causing a blur called chromatic aberration. That is, the distance between the imaging plane and the imaging object is different with respect to each wavelength, thus bringing the state into a state where a wavelength region in focus and a wavelength region out of focus are mixed, and causing reduction in the color contrast of the image during generation of an optical image over a wide wavelength region (for example, the entire visible light band).

A similar chromatic aberration is present also in the wavefront control elements 53 and 54 in this embodiment. As understood from Formula (1), as the wavelength of the light 120 from the imaging object becomes apart from the designed wavelength, the two-dimensional distribution of phase delay amounts deviates from a predetermined design. In a case where the wavefront control elements 53 and 54 function as an off-axis lens, the focal length is mainly changed. Consequently, the first embodiment has a possibility that during polarization imaging over a wide wavelength region (for example, the entire visible light band), a clear image cannot be obtained in a specific wavelength region owing to the adverse effects of the chromatic aberration. On the contrary, adoption of the image-pickup unit array in this embodiment can generate a polarization image that has the same optical magnification and a small focus deviation with respect to the wavelength region of each color filter 121a, 121b, 121c in each image-pickup unit. Furthermore, all the generated polarization images are subjected to signal processing and image rearrangement in the signal processing unit 35 according to the two-dimensional position of the image-pickup unit array, thereby allowing generation of clear polarization images with a recovered resolution with respect to each wavelength region. For example, in the case where the light 120 from the imaging object is in the visible light band, clear polarization images can be respectively generated in R, G and B wavelength regions. Furthermore, light intensity images in R, G and B wavelength regions can be taken from these polarization images, thereby allowing generation of an RGB color image with a reduced effect of chromatic aberration.

Note that in this embodiment, one type of color filter among 121a, 121b and 121c is associated with each image-pickup unit. Accordingly, the number of pixels used for the resolution recovery process in one wavelength region is 1/(the number of types of color filters) in comparison with the case of the first embodiment. Consequently, the resolution of the polarization image generated after resolution recovery process decreases. Even in a case where a typical color image sensor is adopted as the pixel array 52a, only photoelectric conversion signals corresponding to colors in the respective image-pickup units are selected and extracted, thereby allowing similar imaging.

Also according to the configuration of this embodiment, the advantageous effects in the first embodiment can be exerted. The adverse effects of the chromatic aberration in the imaging optical system can be reduced. Selection of the color filters 121a, 121b and 121c and setting of the number of types to a predetermined configuration can simultaneously obtain pieces of polarization information in specific wavelength regions.

In this embodiment, modification similar to that of the first embodiment can be made. Furthermore, this embodiment can be achieved together with the configuration including the polarization filter array 111 in the second embodiment, and can also exert the advantageous effects by the polarization filter array 111 and the color filter array 121 at the same time.

REFERENCE SIGNS LIST 10, 20 Incident light
11, 21, 31, 41 Imaging object
12 Imaging optical system
13 Image-pickup element
13a Polarization filter
13b Image sensor
22 Microlens array
23a Polarization filter array
23b Image sensor 30, 40, 50, 60a, 60b, 110, 120 Light from imaging object
33, 55, 90 Image-pickup unit array
33a Wavefront control element array
33b, 42a Pixel array
33c, 42b, 52b Substrate
34 Wiring
35 Signal processing unit
36 Image signal output path
43, 53, 54, 91 Wavefront control element
43a, 53a, 60 Microscopic structure support substrate
43b, 51, 53b Microscopic structure
111 Polarization filter array
111a, 111b Polarization filter
121 Color filter array
121a, 121b, 121c Color filter

The invention claimed is:

1. A polarization imaging image-pickup system generating a polarization image of an imaging object, comprising:
an image-pickup unit array that includes a plurality of image-pickup units arranged two-dimensionally, wherein the image-pickup units each comprise:
one wavefront control element that includes a plurality of microscopic structures; and
a pixel array that is arranged so as to face the wavefront control element, and includes a plurality of pixels that are associated with the wavefront control element and are two-dimensionally arranged, and
light from an imaging object is spatially separated by the one wavefront control element into first polarized light, and a second polarized light that is in a direction orthogonal to the first polarized light or has a rotation direction opposite to a rotation direction of the first polarized light, the first polarized light is collected at a first collection position on the pixel array, and the second polarized light is collected at a second collection position on the pixel array.

2. The polarization imaging image-pickup system according to claim 1,
wherein the wavefront control element has two regions bounded by a line intersection that includes a perpendicular bisector of a line segment connecting the first collection position and the second collection position on the pixel array, and intersects with a plane perpendicular to the pixel array, and
has first sections that are on the wavefront control element and are of first microscopic structures arranged in one of the regions, and second sections that are on the wavefront control element and are of second microscopic structures that are arranged in the other region and correspond to the respective first microscopic structures, and
positions of the first sections and positions of the second sections are apart by identical distances from the line intersection, on a plane of the wavefront control element, and
the first sections have shapes obtained by rotating shapes of the second sections by 90° horizontally with respect to the plane of the wavefront control element.

3. The polarization imaging image-pickup system according to claim 2,
wherein the image-pickup unit array includes a first wavefront control element and a second wavefront control element included in each of the adjoining image-pickup units,
a direction of the first polarized light spatially separated from the light from the imaging object by the first wavefront control element is different from a direction of the first polarized light spatially separated from the light from the imaging object by the second wavefront control element, and
the image-pickup unit array generates the polarization images twice as many as the number of image-pickup units that are included in the image-pickup unit array and have polarization directions different from each other.

4. The polarization imaging image-pickup system according to claim 2,
wherein the wavefront control element includes the microscopic structures on a plane facing the pixel array, and
the microscopic structures have an identical height from the plane of the wavefront control element.

5. The polarization imaging image-pickup system according to claim 2,
wherein the image-pickup unit array further includes a barrier that shields the first polarized light and the second polarized light, between the adjoining image-pickup units, and
the barrier is arranged between the wavefront control element and the pixel array, and is provided so as to be substantially perpendicular to the plane of the wavefront control element and a plane of the pixel array.

6. The polarization imaging image-pickup system according to claim 2,
wherein the image-pickup unit array further includes a polarization filter array that includes a first polarized filter, and a second polarization filter,
the first polarized light is collected at the first collection position, through the first polarized filter that passes only a polarization direction of the first polarized light, and
the second polarized light is collected at the second collection position, through the second polarized filter that passes only a polarization direction of the second polarized light.

7. The polarization imaging image-pickup system according to claim 2,
wherein the image-pickup unit array includes a color filter array that includes one or more color filters,
the color filter passes only a predetermined wavelength region of the light from the imaging object or the first polarized light and the second polarized light, and
the color filters are arranged such that one of the color filters corresponds to one of the image-pickup unit.

8. The polarization imaging image-pickup system according to claim 2, wherein in the pixel array, based on a first polarization image generated based on the first polarized light, or on a second polarization image generated based on the second polarized light, two-dimensional information on at least a light intensity, a polarization direction, and a polarization degree of the light from the imaging object is obtained.

* * * * *